(12) United States Patent
Chen

(10) Patent No.: US 12,396,244 B2
(45) Date of Patent: Aug. 19, 2025

(54) SEMICONDUCTOR STRUCTURE

(71) Applicant: TAIWAN SEMICONDUCTOR MANUFACTURING COMPANY LTD., Hsinchu (TW)

(72) Inventor: Chien-Hao Chen, Yilan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/736,589

(22) Filed: Jun. 7, 2024

(65) Prior Publication Data
US 2024/0321644 A1 Sep. 26, 2024

Related U.S. Application Data

(60) Continuation of application No. 18/358,010, filed on Jul. 24, 2023, now Pat. No. 12,033,897, which is a division of application No. 17/161,074, filed on Jan. 28, 2021, now Pat. No. 11,756,834.

(51) Int. Cl.
| | |
|---|---|
| *H10D 84/01* | (2025.01) |
| *H10D 64/66* | (2025.01) |
| *H10D 64/68* | (2025.01) |
| *H10D 84/03* | (2025.01) |
| *H10D 84/83* | (2025.01) |

(52) U.S. Cl.
CPC ........ *H10D 84/014* (2025.01); *H10D 64/667* (2025.01); *H10D 64/691* (2025.01); *H10D 84/0144* (2025.01); *H10D 84/0158* (2025.01); *H10D 84/038* (2025.01); *H10D 84/834* (2025.01)

(58) Field of Classification Search
CPC .. H10D 84/014; H10D 64/667; H10D 84/834; H10D 84/0158; H10D 84/0111; H10D 64/691; H10D 84/038
See application file for complete search history.

(56) References Cited

U.S. PATENT DOCUMENTS

| | | | |
|---|---|---|---|
| 2014/0048885 A1* | 2/2014 | Nakamura | ...... H01L 21/823842 257/E27.06 |
| 2017/0084711 A1* | 3/2017 | Lim | ...................... H01L 27/092 |

* cited by examiner

*Primary Examiner* — Christine A Enad
(74) *Attorney, Agent, or Firm* — WPAT LAW; Anthony King

(57) ABSTRACT

A semiconductor structure includes a first multi-gate transistor and a second multi-gate transistor. The first multi-gate transistor includes a first Al-containing high-k dielectric layer having a first Al concentration, and a W-and-N-containing barrier layer. The second multi-gate transistor includes a second Al-containing high-k dielectric layer having a second Al concentration. The first Al concentration is less than the second Al concentration.

20 Claims, 21 Drawing Sheets

SEMICONDUCTOR STRUCTURE

PRIORITY CLAIM AND CROSS-REFERENCE

This patent is a continuation application of U.S. patent application Ser. No. 18/358,010, filed on Jul. 24, 2023, entitled of "METHOD FOR FORMING SEMICONDUCTOR STRUCTURE," which is a divisional application of U.S. patent application Ser. No. 17/161,074, filed on Jan. 28, 2021, entitled of "SEMICONDUCTOR STRUCTURE AND METHOD FOR FORMING THE SAME", which is incorporated by reference in its entirety.

BACKGROUND

The electronics industry has experienced an ever increasing demand for smaller and faster electronic devices that are able to support greater numbers of increasingly complex and sophisticated functions. Accordingly, there is a continuing trend in the semiconductor industry to manufacture low-cost, high-performance, low-power integrated circuits (ICs). Thus far these goals have been achieved in large part by scaling down semiconductor IC dimensions (e.g., minimum feature size) and thereby improving production efficiency and reducing associated costs. However, such downscaling has also introduced increased complexity to the semiconductor manufacturing process. Thus, the realization of continued advances in semiconductor ICs and devices required similar advances in semiconductor manufacturing processes and technology.

As technology nodes achieve progressively smaller scales, in some IC designs, researchers have hoped to replace a typical polysilicon gate with a metal gate to improve device performance by decreasing feature sizes. One approach of forming the metal gate is called a "gate-last" approach, sometimes referred to as replacement polysilicon gate (RPG) approach. In the RPG approach, the metal gate is fabricated last, which allows for a reduced number of subsequent operations.

Further, as the dimensions of a transistor decrease, the thickness of the gate dielectric layer may be reduced to maintain performance with a decreased gate length. In order to reduce gate leakage, a high dielectric constant (high-k or HK) gate dielectric layer is used to provide a thickness as effective as that provided by a typical gate oxide used in larger technology nodes. A high-k metal gate (HKMG) approach including the metal gate electrode and the high-k gate dielectric layer is therefore recognized. However, the HKMG approach is a complicated approach, and many issues arise.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
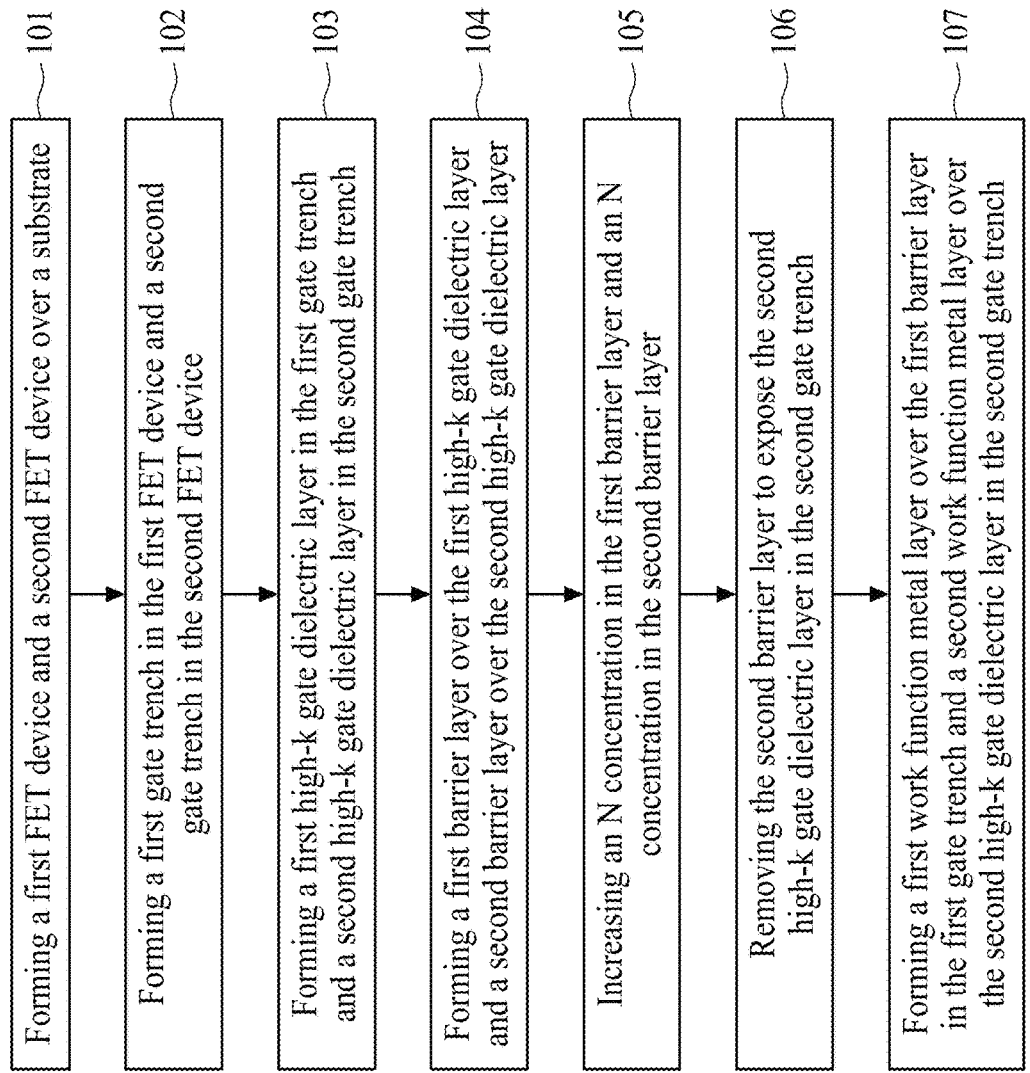
FIG. 1 is a flowchart representing a method for forming a semiconductor structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

With the ongoing down-scaling of integrated circuits, power supply voltages of the circuits may be reduced. However, the voltage reduction may be different in different circuits or regions. For example, threshold voltage (Vt) requirements may be different between the memory circuits and the core circuits. A multiple-Vt capability is therefore required for device design.

Further, as the gate length (Lg) scale is reduced in advanced nodes, to realize the multiple-Vt design using different gate metal materials becomes challenging due to the limited Lg and the gap-filling ability requirements.

Embodiments of a method for forming a semiconductor structure are therefore provided. The semiconductor structure is formed in an HKMG process in accordance with the embodiments. The semiconductor structure can be formed in a planar device process according to some embodiments. The semiconductor structure can be formed in a non-planar device in alternative embodiments. In some embodiments, the method for forming the semiconductor structure includes in-situ and/or ex-situ nitridation on barrier layers. The barrier layers with different nitrogen (N) concentrations may have different metal barrier abilities. In some embodiments, when the metal includes aluminum (Al), the barrier including greater N concentration provides greater Al-diffusion barrier ability. Further, the greater Al-diffusion barrier ability is required by higher-voltage devices. Accordingly, the method provides barriers with different N concentrations to meet multiple-Vt structure requirements.

FIG. 1 is a flowchart representing a method for forming a semiconductor structure 10 according to aspects of the present disclosure. The method 10 includes a number of operations (101, 102, 103, 104, 105, 106, and 107). The method 10 will be further described according to one or more embodiments. It should be noted that the operations of the method 10 may be rearranged or otherwise modified within the scope of the various aspects. It should be further noted that additional processes may be provided before, during, and after the method 10, and that some other processes may just be briefly described herein. Thus, other implementations are possible within the scope of the various aspects described herein.

Figure 2:
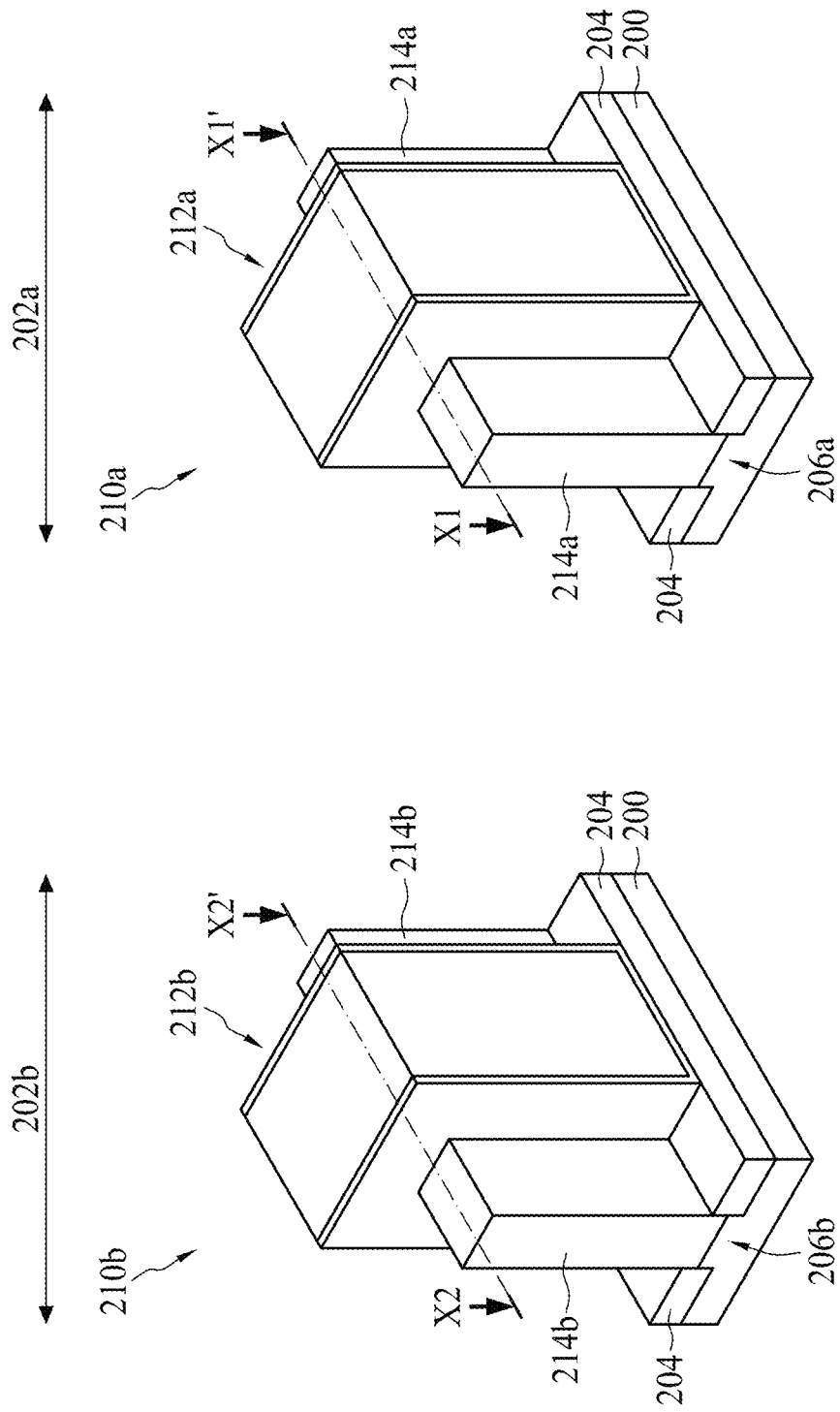
FIG. 2 shows perspective views illustrating portions of a semiconductor structure at a fabrication stage according to aspects of the present disclosure in one or more embodiments.

FIG. 2 shows perspective views illustrating portions of a semiconductor structure according to aspects of the present disclosure. In some embodiments, in operation 101, the method 10 include forming a first FET device 210a and a second FET device 210b over a substrate 200. In some embodiments, the substrate 200 may be a semiconductor substrate such as a silicon substrate. The substrate 200 may also include other semiconductors such as germanium (Ge), silicon carbide (SiC), silicon germanium (SiGe), or diamond. Alternatively, the substrate 200 may include a compound semiconductor and/or an alloy semiconductor. The substrate 200 may include various layers, including conductive or insulating layers formed on a semiconductor substrate. The substrate 200 may include various doping configurations depending on design requirements, as is known in the art. For example, different doping profiles (e.g., n wells or p wells) may be formed on the substrate 200 in regions designed for different device types (e.g., n-type field-effect transistors (NFET), or p-type field-effect transistors (PFET)). The suitable doping may include ion implantation of dopants and/or diffusion processes.

In some embodiments, the substrate 200 may include a first region 202a and a second region 202b. Further, the substrate 200 may include isolation structures, e.g., shallow trench isolation (STI) structures 204 interposing the first and second regions 202a and 202b. The first and second regions 202a and 202b are defined for accommodating different devices. For example, the first region 202a may accommodate a high voltage (HV) device while the second region 202b may accommodate a low voltage (LV) device. In some embodiments, the HV device used herein is a device having an operating voltage greater than that of the LV device. However, operating voltages can vary for different applications, thus they are not limited herein.

In some embodiments, the devices 210a and 210b may be planar transistors or multi-gate transistors, such as fin-like FETs (FinFETs).

In some embodiments, in operation 101, the first FET device 210a is formed in the first region 202a. In some embodiments, the first FET device 210a may be an HV device. In some embodiments, the first FET device 210a may an n-type HV device, but the disclosure is not limited thereto. The first FET device 210a may include a first gate structure 212a and a first source/drain 214a. In some embodiments, the first FET device 210a may be a first FinFET device, and a first fin structure 206a is disposed over the substrate 200, as shown in FIG. 2. A portion of the first fin structure 206a covered by the first gate structure 212a serves as a channel region, and portions of the first fin structure 206a exposed through the first gate structure 212a serve as the first source/drain 214a.

In operation 101, the second FET device 210b is formed in the second region 202b. In some embodiments, the second FET device 210b may be an LV device. In some embodiments, the second FET device 210a may be an n-type LV device, but the disclosure is not limited thereto. The second FET device 210b may include a second gate structure 212b and a second source/drain 214b. In some embodiments, the second FET device 210b is a second FinFET device, and a second fin structure 206b is disposed over the substrate 200, as shown in FIG. 2. Similar to the first FET device 210a described above, in the second FET device 210b, a portion of the second fin structure 206b covered by the second gate structure 212b serves as a channel region, and portions of the second fin structure 206b exposed through the second gate structure 212b serve as the second source/drain 214b.

In some embodiments, the first gate structure 212a and the second gate structure 212b are sacrificial gate structures. The first and second sacrificial gate structures may respectively include a dielectric layer and a sacrificial semiconductor layer. In some embodiments, the semiconductor layers are made of polysilicon, but the disclosure is not limited thereto. In some embodiments, spacers 216 (shown in FIG. 3) can be formed over sidewalls of the sacrificial gate structures. In some embodiments, the spacers 216 are made of silicon nitride (SiN), silicon carbide (SiC), silicon oxide (SiO), silicon oxynitride (SiON), silicon carbide or any other suitable material, but the disclosure is not limited thereto. In some embodiments, the spacers 216 are formed by deposition and etch back operations.

As shown in FIG. 2, in some embodiments, the first source/drain 214a is formed over the first fin structure 206a at two opposite sides of the first gate structure 212a. Similarly, the second source/drain 214b is formed over the second fin structure 206b at two opposite sides of the second gate structure 212b. In some embodiments, heights of the first source/drain 214a and the second source/drain 214b may be greater than heights of the first and second fin structures 206a and 206b. In some embodiments, the first and second source/drain 214a and 214b may be formed by forming recesses in the fin structures 206a and 206b and growing a strained material in the recesses by an epitaxial (epi) process. In addition, the lattice constant of the strained material may be different from the lattice constant of the fin structures 206a and 206b. Accordingly, the first and second source/drain 214a and 214b may serve as stressors that improve carrier mobility. In some embodiments, the first source/drain 214a and the second source/drain 214b may both include n-type dopants. However, a dopant concentration of the first source/drain 214a may be different from that of the second source/drain 214b.

Figure 3:
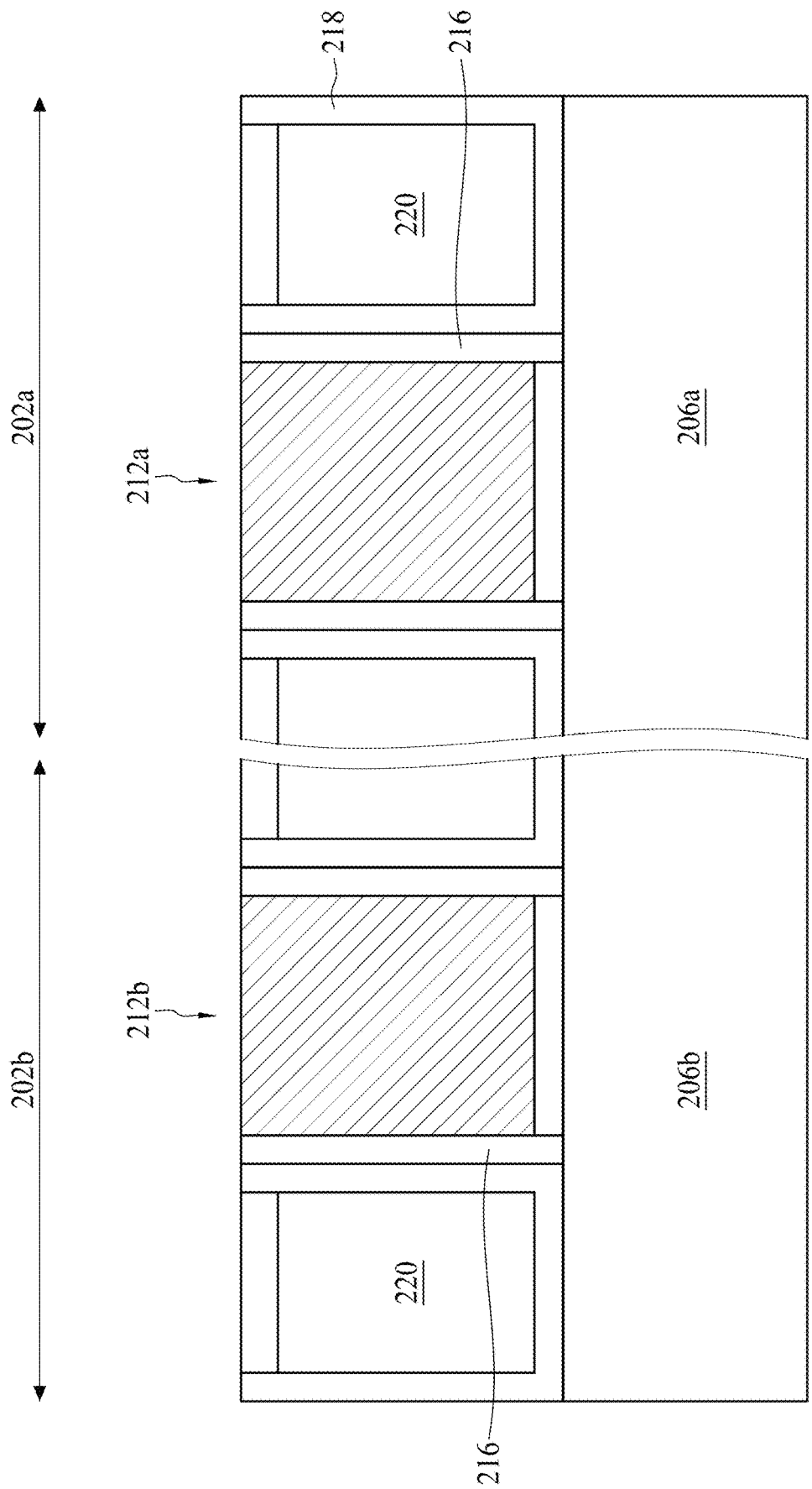
FIG. 3 shows cross-sectional views taken along lines X1-X1' and X2-X2' of FIG. 2, respectively.

In some embodiments, after the forming of the source/drain structures, a contact etch stop layer (CESL) 218 may be formed to cover the first and second gate structures 212a and 212b over the substrate 200. In some embodiments, the CESL 218 can include silicon nitride, silicon oxynitride, and/or other applicable materials. Subsequently, an interlayer dielectric (ILD) structure 220 may be formed on the CESL 218 in accordance with some embodiments. The ILD structure 220 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon-doped silicon oxide, amorphous fluorinated carbon, parylene, bis-benzocyclobutenes (BCB), or polyimide. Next, a polishing process is performed on the ILD structure 220 and the CESL 218 to expose top surfaces of the first and second gate structures 212a and 212b, as shown in FIG. 3. In some embodiments, the ILD structure 220 and the CESL 218 are planarized by a chemical mechanical polishing (CMP) process until the top surfaces of the first and second gate structures 212a and 212b are exposed. Consequently, the ILD structure 220 surrounds the first and second gate structures 212a, 212b and the first and second fin structures 206a, 206b. In other words, the fin structures 206a, 206b and the sacrificial gate structures 212a, 212b are embedded in the ILD structure 220, while a top surface of the sacrificial gate structures 212a, 212b remains exposed, as shown in FIG. 3.

Figure 4:
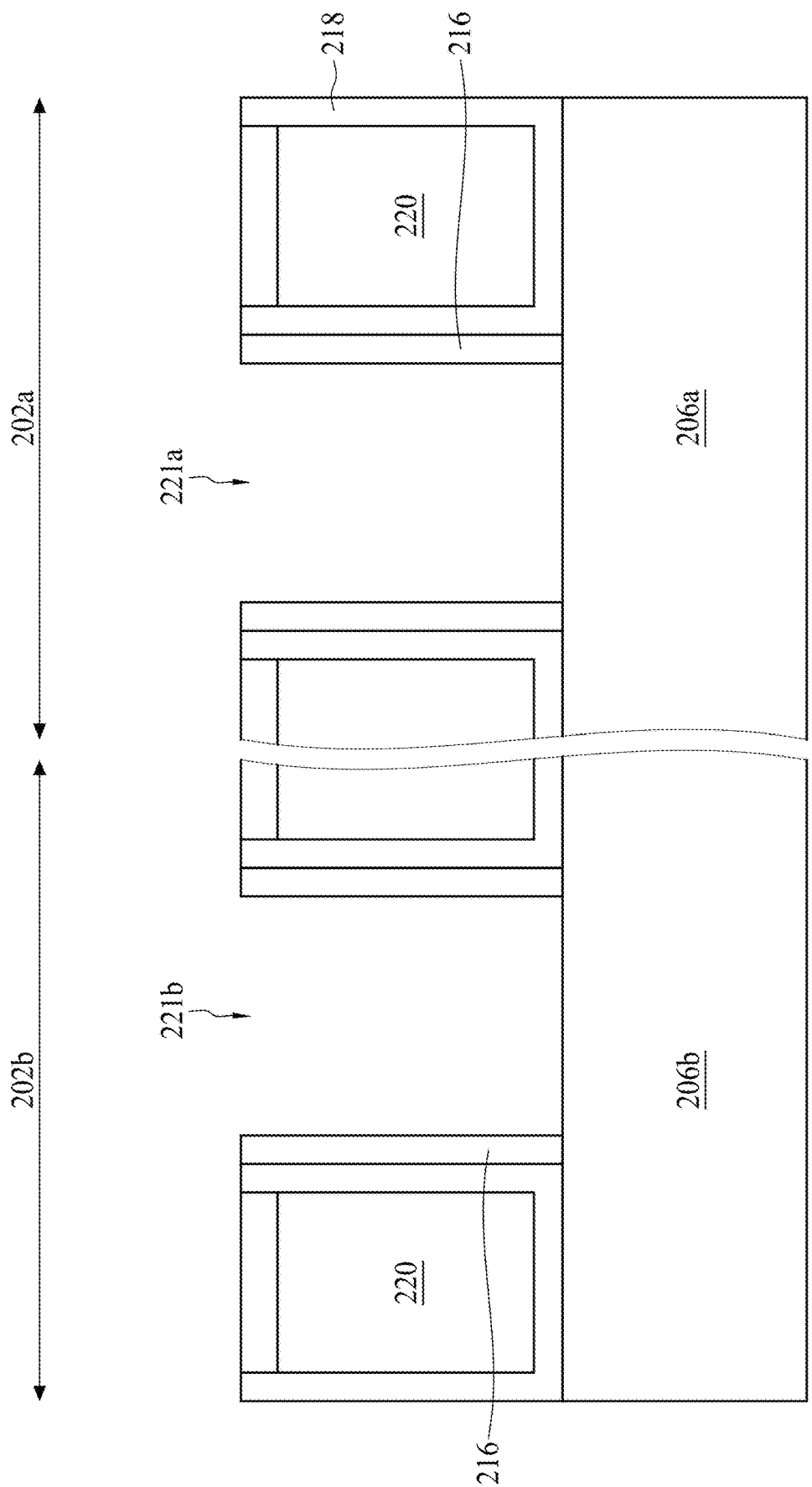
FIGS. 4 to 11 are schematic drawings illustrating the semiconductor structure at various fabrication stages subsequent the stages shown in to FIG. 3 according to aspects of the present disclosure in one or more embodiments.

Referring to FIG. 4, in some embodiments, in operation 102, the method 10 includes forming a first gate trench 221a in the first FET device 210a and a second gate trench 221b in the second FET device 210b. In some embodiments, the sacrificial semiconductor layer is removed. In some embodiments, the dielectric layer may be removed for forming an interfacial layer (IL). In some embodiments, the dielectric layer may be left in the gate trench, though not shown. It should be noted that the removal of the dielectric layer may be performed depending on different process or product requirements. Accordingly, the first fin structure 206a is exposed through the first gate trench 221a, and the second fin structure 206b is exposed through the second gate trench 221b, as shown in FIG. 4. Additionally, in some embodiments, a protecting cap may be formed over the ILD structure 220. The protecting cap may include a material different from that of the ILD structure 220. The protecting cap protects the ILD structure 220 during the removing of the sacrificial semiconductor layer and other subsequent operations.

Figure 5:
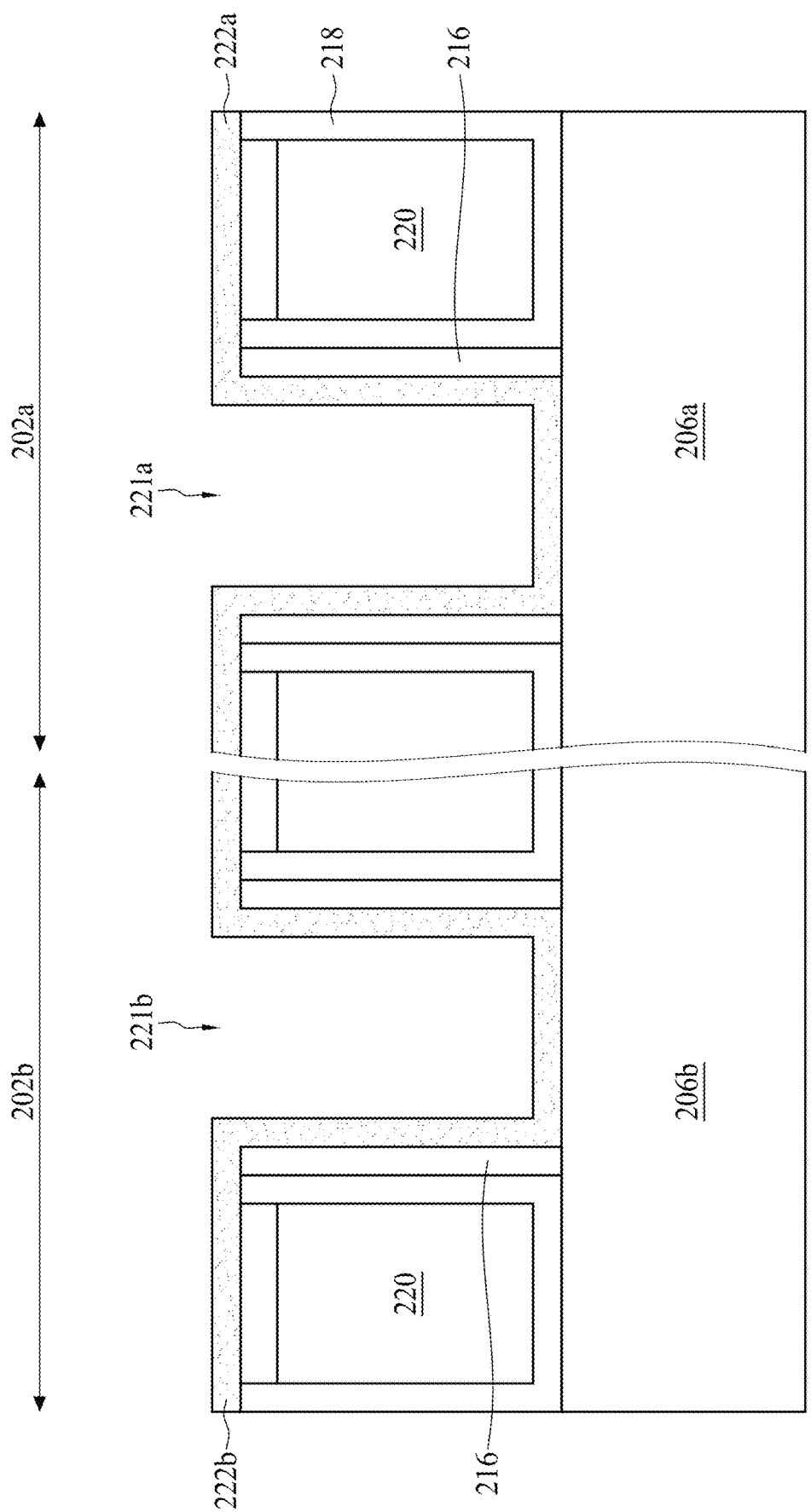

Referring to FIG. 5, in some embodiments, in operation 103, the method 10 includes forming a first high-k gate dielectric layer 222a in the first gate trench 221a and a second high-k gate dielectric layer 222b in the second gate trench 221b. A thickness of the first high-k gate dielectric layer 222a and a thickness of the second high-k gate dielectric layer 222b are similar. In some embodiments, the thicknesses of the first and second high-k gate dielectric layers 222a and 222b may be between approximately 1 nanometer and approximate 3 nanometers, but the disclosure is not limited thereto. In some embodiments, an IL layer may be formed prior to the forming of the first and second high-k gate dielectric layers 222a and 222b, though not shown. The IL layer may include an oxide-containing material such as SiO or SiON. In some embodiments, the IL layer covers portions of the fin structures 206a, 206b exposed in the gate trenches 221a, 221b. The first and second high-k gate dielectric layers 222a and 222b may be simultaneously formed on the IL layer. In some embodiments, the first and second high-k gate dielectric layers 222a and 222b may be conformally formed in the gate trenches 221a and 221b. Accordingly, the first high-k gate dielectric layer 222a covers at least sidewalls of the first gate trench 221a, and the second high-k gate dielectric layer 222b covers at least sidewalls of the second gate trench 221b. In some embodiments, the first and second high-k gate dielectric layers 222a and 222b include a high-k dielectric material having a high dielectric constant, for example, greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride (HfOxNy), other suitable metal-oxides, or combinations thereof.

Figure 6:
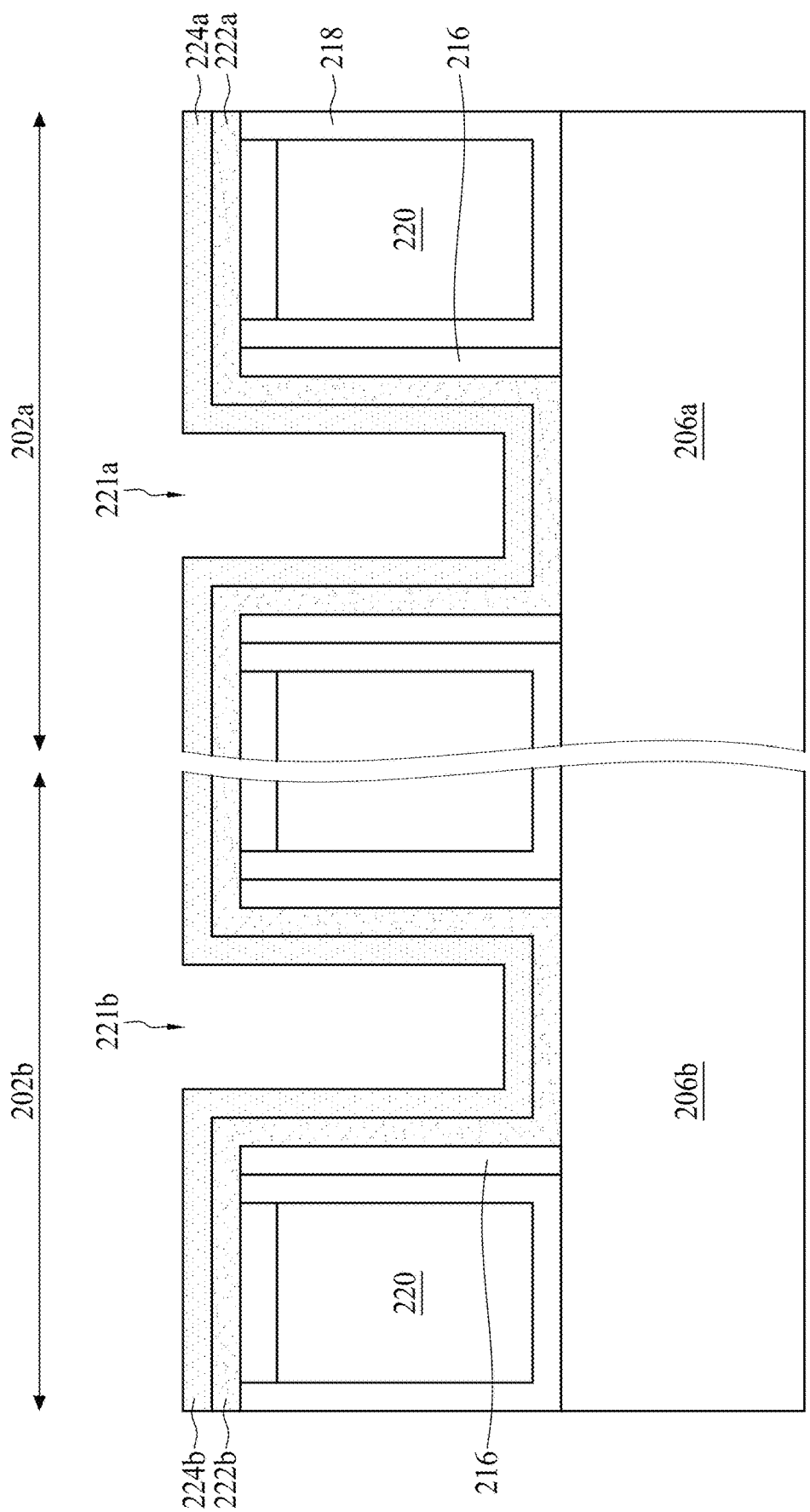

Referring to FIG. 6, in some embodiments, in operation 104, the method 10 includes forming a first barrier layer 224a over the first high-k gate dielectric layer 222a and a second barrier layer 224b over the second high-k gate dielectric layer 222b. In some embodiments, the first and second barrier layers 224a and 224b are formed simultaneously. In some embodiments, the first and second barrier layers 224a and 224b may be conformally formed in the gate trenches 221a and 221b. A thickness of the first barrier layer 224a and a thickness of the second barrier layer 224b are similar. In some embodiments, the thicknesses of the first and second barrier layers 224a and 224b may be between approximately 0.1 nanometer and approximately 10 nanometers, but the disclosure is not limited thereto. For example, the thicknesses of the first and second barrier layers 224a and 224b may be less than approximately 1.5 nanometer. Further, the first and second barrier layers 224a and 224b include a same material. In some embodiments, the first and second barrier layers 224a and 224b both include tungsten (W). For example, the first and second barrier layers 224a and 224b may include W-based metal, such as WNx, WCx, WCxNy, W-based metal with oxygen, W-based metal without oxygen, or combinations thereof. Further, a W concentration in each of the first and second barrier layers 224a and 224b is between approximately 10% and approximately 70%, but the disclosure is not limited thereto.

In some embodiments, in operation 105, the method 10 includes increasing a nitrogen (N) concentration in the first barrier layer 224a and an N concentration in the second barrier layer 224b. Further, the increasing of the N concentrations includes an in-situ treatment and/or an ex-situ treatment. In some embodiments, the N concentration in the first and second barrier layers 224a and 224b may be increased by the in-situ treatment. The in-situ treatment includes a prolonged ammonia ($NH_3$) pulse during the forming of the first and second barrier layers 224a and 224b and/or a post-ammonia soak. In some embodiments, a deposition method may be used to form the first and second barrier layers 224a and 224b, and a variable supply of nitrogen-excited species through a remote plasma generator may be involved. By controlling the pulse duration, pulse condition, flow rate, and therefore chemical availability, the N concentration of the first and second barrier layers 224a and 224b can be adjusted. In some embodiments, a post-$NH_3$ soak may be used in a thermal environment or a plasma environment. By controlling soak duration, soak condition, and therefore chemical availability, the N concentration of the first and second barrier layers 224a and 224b can be adjusted. In some embodiments, the W-N bonding can be enhanced in the $NH_3$ environment or by plasma. In some comparative approaches, when the W-containing barrier layers 224a and 224b are exposed to air, tungsten oxide tends to be formed. However, the in-situ treatment helps to form more robust W-N bonding for better oxidation resistance, thus mitigating the oxidation issue. In other words, oxidation immunity of the barrier layers 224a and 224b may be improved by the in-situ treatment.

Figure 7:
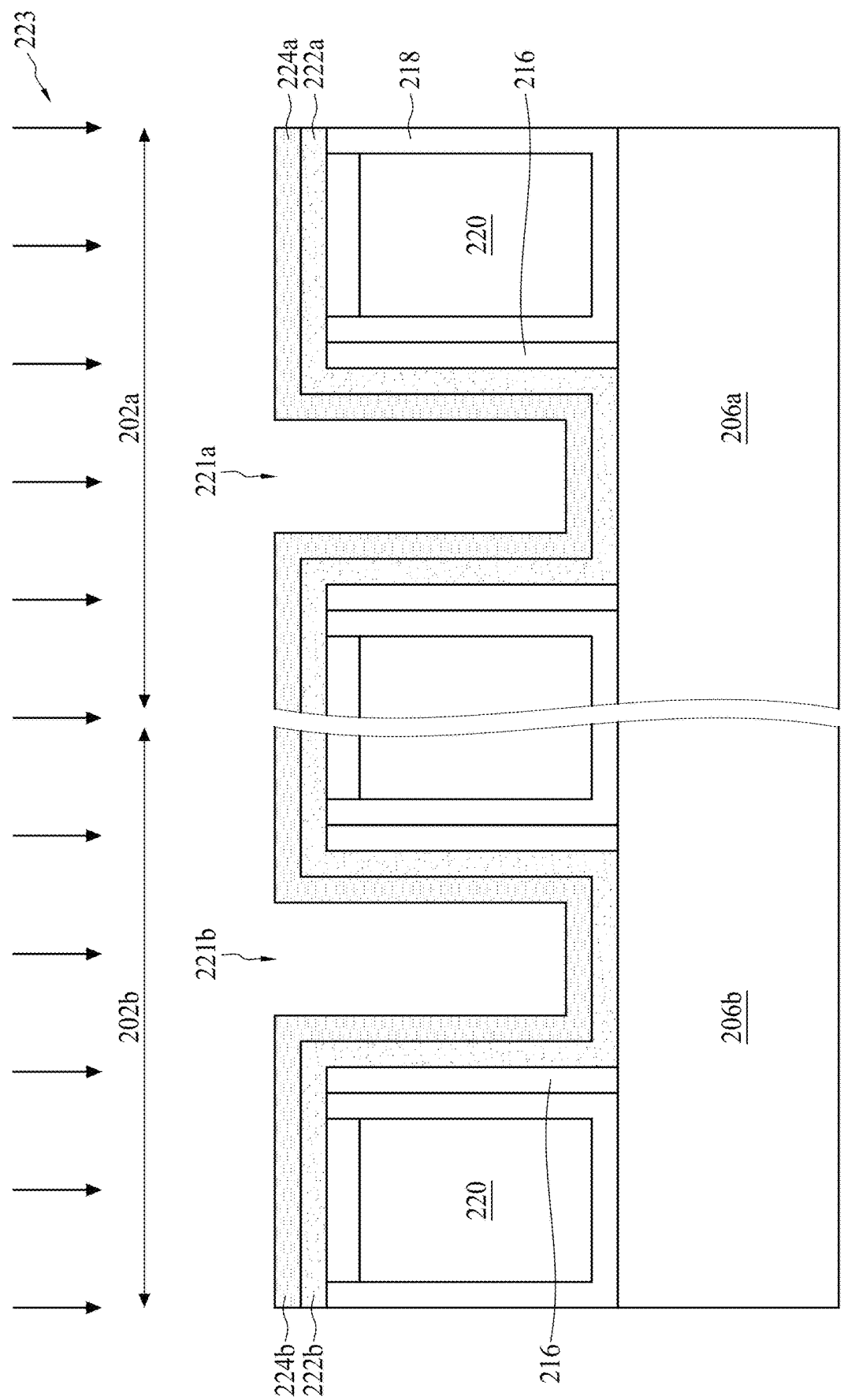

Referring to FIG. 7, in some embodiments, the N concentration in the first and second barrier layers 224a and 224b may be increased by the ex-situ treatment. In some embodiments, the ex-situ treatment may be performed after the in-situ treatment. In other embodiments, the ex-situ treatment may be performed directly after the forming of the first and second barrier layers 224a and 224b. In still other embodiments, the ex-situ treatment may be omitted. The ex-situ treatment may include a nitridation 223 using $NH_3$, nitrogen ($N_2$), triatomic hydrogen ($H_3$), inert gas, or combinations thereof. In some embodiments, the nitridation 223 may be performed at a temperature between approximately 200° C. and approximately 600° C., in a pressure between approximately 1 mTorr and approximately 100 mTorr, and in a flow rate between approximately 1 standard cubic centimeters per minute (sccm) and approximately 100 standard liters per minute (slm or slpm). As mentioned above, in some comparative approaches when the W-containing barrier layers 224a and 224b are exposed to air, tungsten oxide tends to be formed. However, the ex-situ treatment helps to reduce surface oxidation and re-form W-N bonding, and thus further mitigates the oxidation issue and improves oxidation immunity.

Accordingly, the first and second barrier layers 224a and 224b may be referred to as N-containing barrier layers after the increasing of the N concentration. Further, the N concentration in each of the first and second N-containing barrier layers 224a and 224b may be increased to between approximately 10% and approximately 70%, but the disclosure is not limited thereto.

Figure 8:
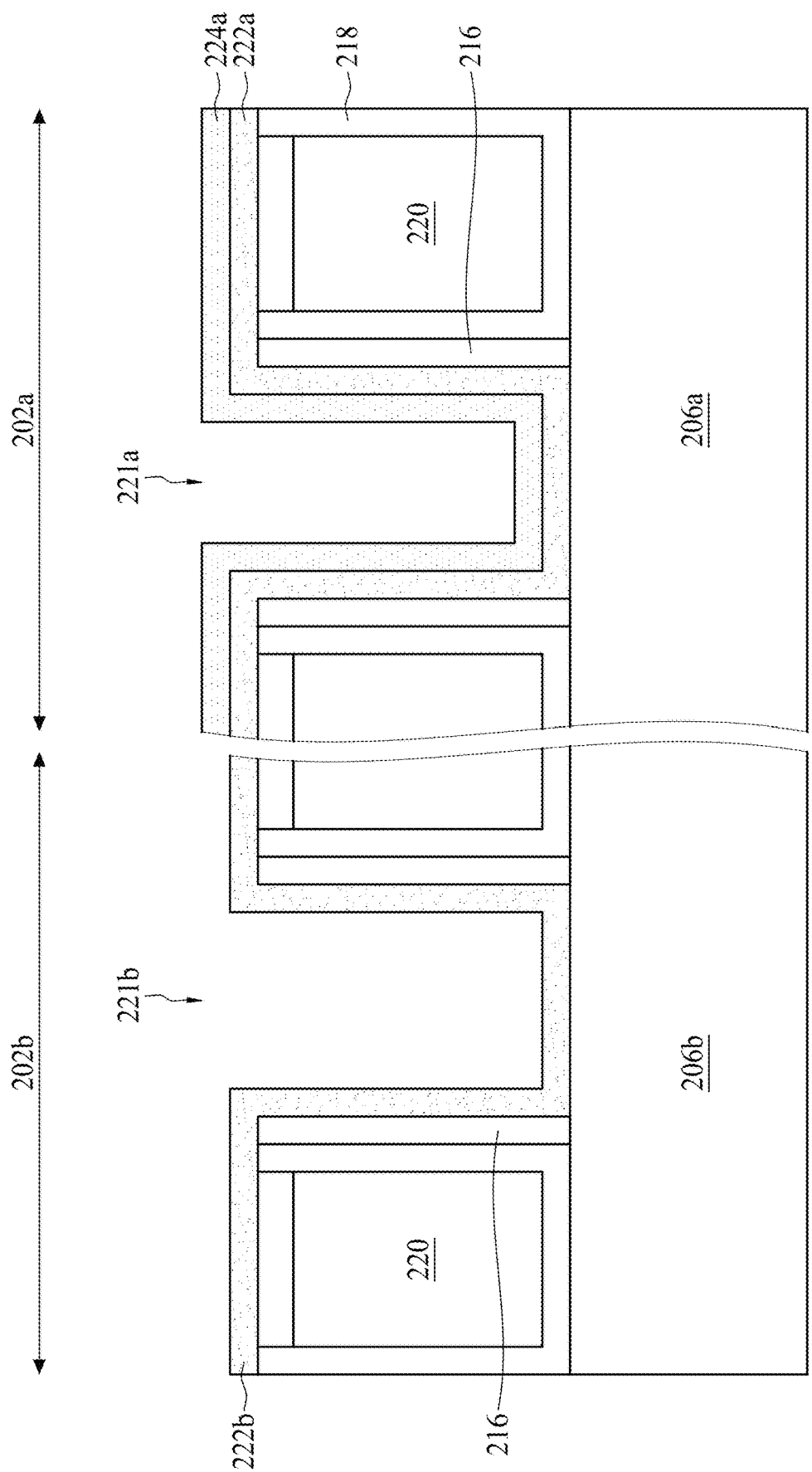

Referring to FIG. 8, in some embodiments, in operation 106, the method 10 includes removing the second barrier layer 224b to expose the second high-k gate dielectric layer 222b in the second gate trench 221b. In some embodiments, a protecting layer or a masking layer may be formed in the first region 202b, and a suitable etching operation may be performed to remove the second barrier layer 224b. Thus, the second barrier layer 224b is removed from the second region 202b. The protecting layer or the masking layer is removed after the removing of the second barrier layer 224b.

Figure 9:
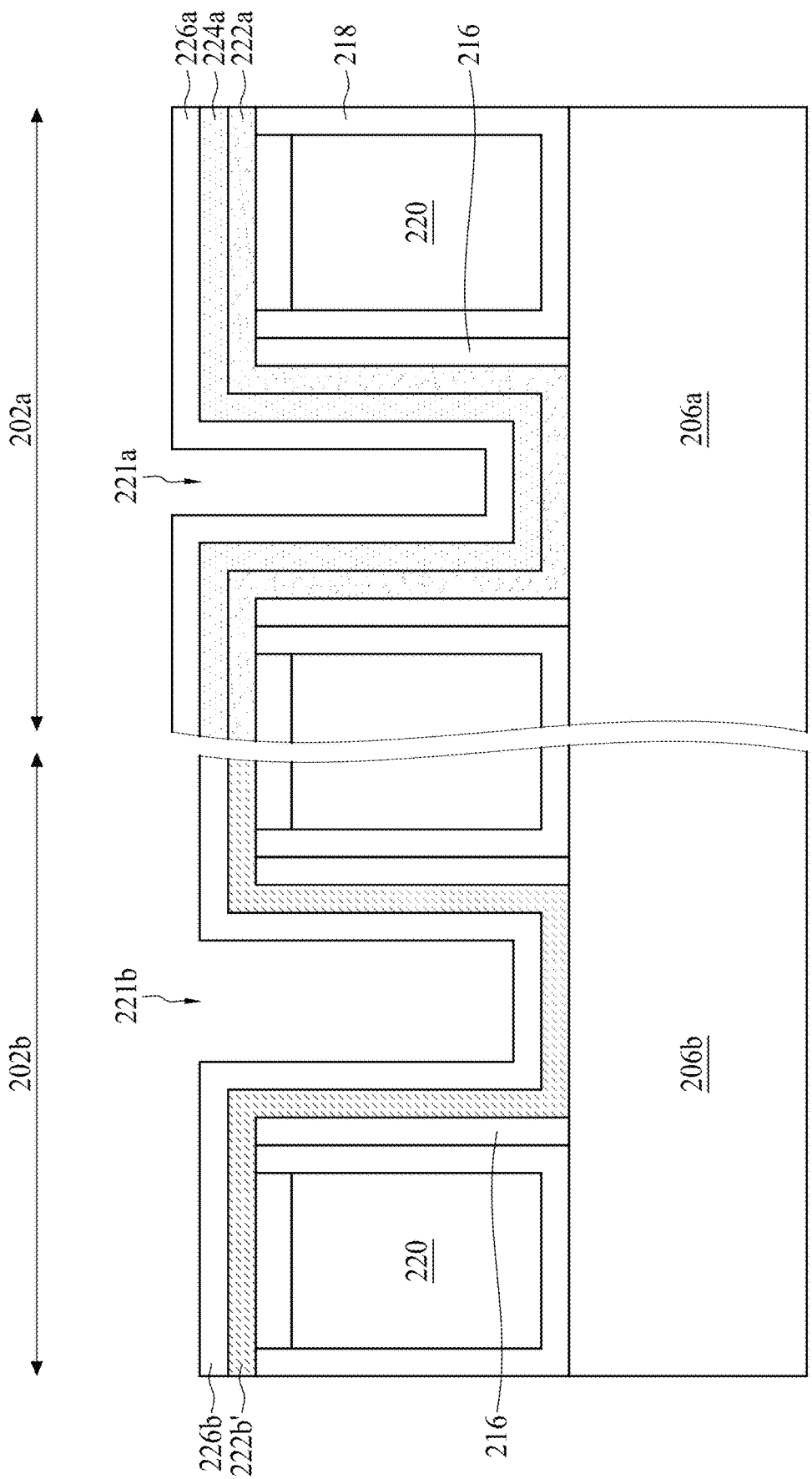

Referring to FIG. 9, in some embodiments, in operation 107, the method 10 includes forming a first work function metal layer 226a over the first barrier layer 224a and a second work function metal layer 226b over the second high-k gate dielectric layer 222b. A thickness of the first work function metal layer 226a and a thickness of the second work function metal layer 226b may be similar. In some embodiments, the thicknesses of the first and second work function metal layers 226a and 226b may be between approximately 0.5 nanometer and approximately 5 nanometers, but the disclosure is not limited thereto. In some embodiments, the first work function metal layer 226a may be in direct contact with the first barrier layer 224a, while the second work function metal layer 226b may be in direct contact with the second high-k gate dielectric layer 222b. A thickness of the first work function metal layer 226a and a thickness of the second work function metal layer 226b may be similar. The first work function metal layer 226a and the second work function metal layer 226b may both be n-type work function metal layers. Further, the first and second work function metal layers 226a and 226b may include same n-type metal materials. In some embodiments, the first work function metal layer 226a and the second work function metal layer 226b may both be n-type work function metal layers including aluminum (Al). In some embodiments, the first and second work function metal layers 226a and 226b may be single-layered structures or multilayers of two or more materials, but the disclosure is not limited thereto. In some embodiments, an Al-containing n-type metal layer may be the layer closest to the first barrier layer 224a and the second high-k gate dielectric layer 222b.

Figure 10:
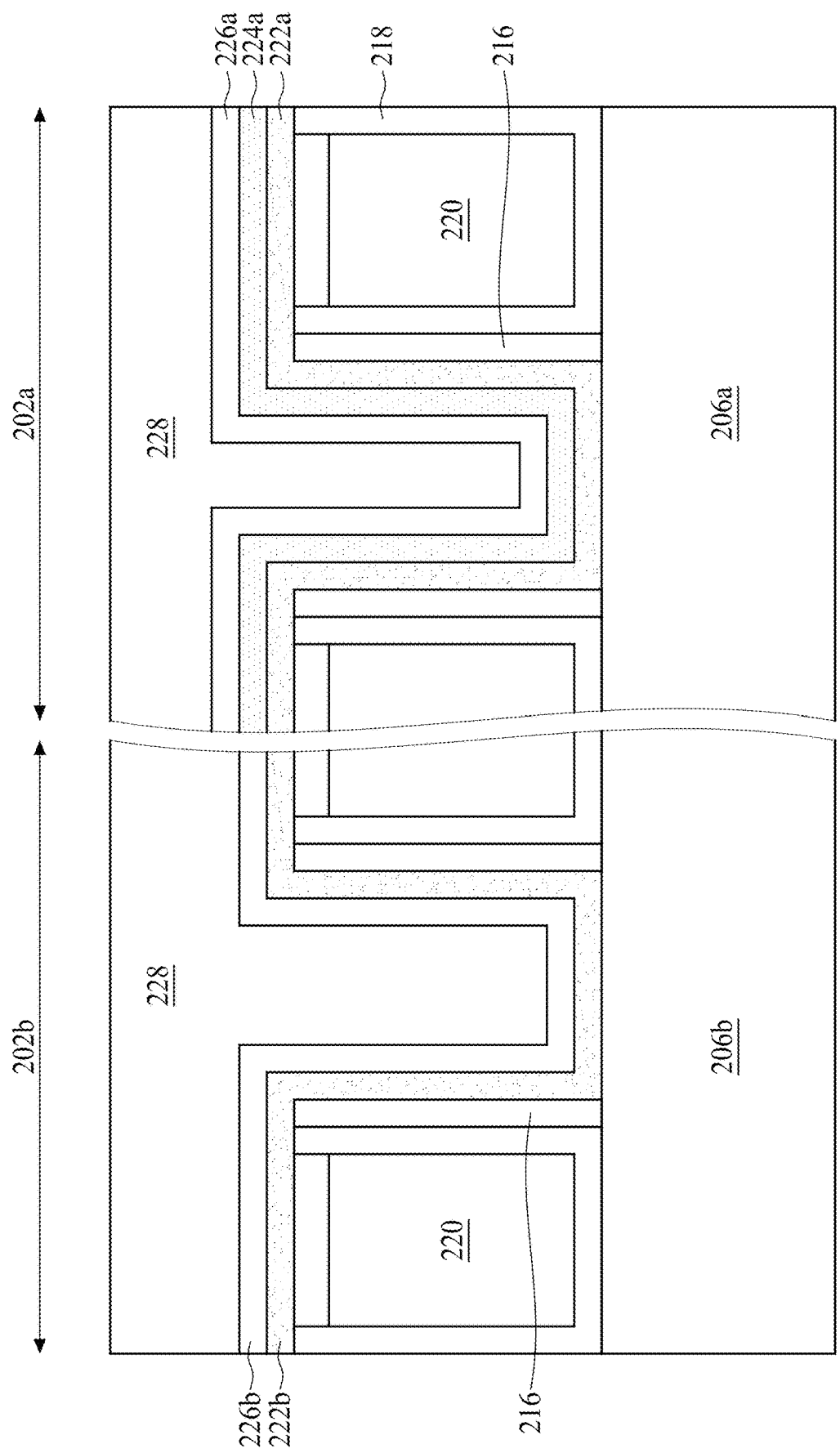

Referring to FIG. 10, in some embodiments, a gap-filling metal layer 228 is formed to fill the first gate trench 221a and the second gate trench 221b. In some embodiments, the gap-filling metal layer 228 can include conductive material such as Al, Cu, AlCu, or W, but is not limited to the above-mentioned materials.

Figure 11:
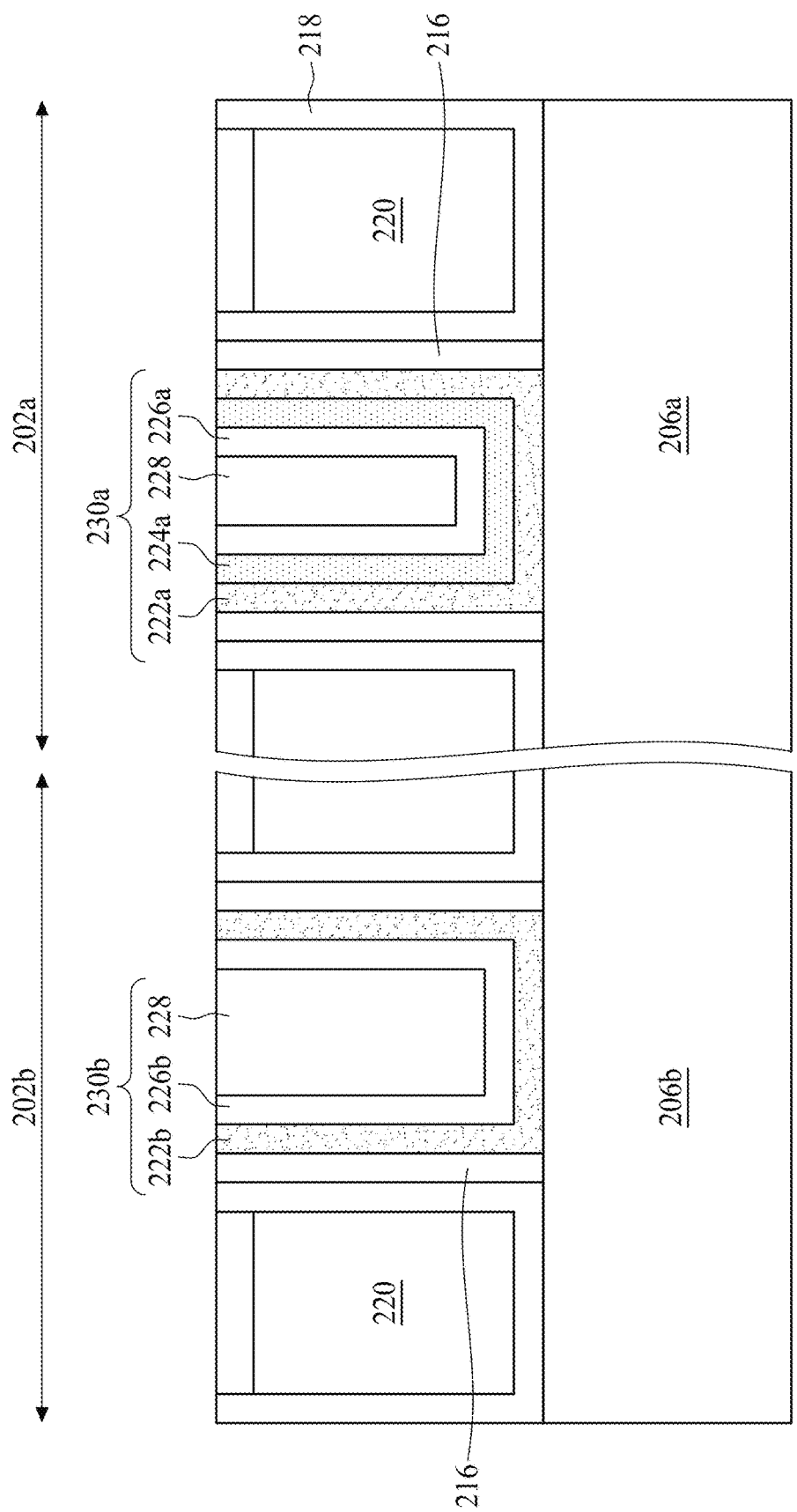

Referring to FIG. 11, in some embodiments, a planarization operation such as a CMP may be performed to remove superfluous layers. Accordingly, portions of the first and second high-k gate dielectric layers 222a and 222b, portions of the first barrier layer 224a, portions of the first and second work function metal layers 226a and 226b, and portions of the gap-filling layer 228 are removed. Thus, a first metal gate structure 230a is formed in the first FET device 210a in the first region 202a, and a second metal gate structure 230b is formed in the second FET device 210b in the second region 202b. In some embodiments, a top surface of the first metal gate structure 230a, a top surface of the second metal gate structure 230b and top surfaces of the ILD structure 220 may be aligned with each other (i.e., the top surfaces may be co-planar).

Accordingly, a semiconductor structure 20 is obtained as shown in in FIG. 11. The semiconductor structure 20 includes the first FET device 210a and the second FET device 210b. As mentioned above, the first FET device 210a and the second FET device 210b may both be FinFET devices. Therefore, the first FET device 210a includes the first metal gate structure 230a over the first fin structure 206a, and the second FET device 210b includes the second metal gate structure 230b over the second fin structure 206b. The first metal gate structure 230a includes the first high-k gate dielectric layer 222a, the first work function metal layer 226a over the first high-k gate dielectric layer 222a, and the first barrier layer 224a between the first work function metal layer 226a and the first high-k gate dielectric layer 222a. In some embodiments, the N concentration in the first barrier layer 224a is between approximately 10% and approximately 70%. Therefore, the first barrier layer 224a is referred to as an N-containing barrier layer. The second metal gate structure 230b includes the second high-k gate dielectric layer 222b and the second work function metal layer 226b over the second high-k gate dielectric layer 222b. As mentioned above, the first and second work function metal layers 226a and 226b may be n-type work function metal layers. Further, the first and second work function metal layers 226a and 226b may be Al-containing n-type work function metal layers.

In some embodiments, it is found that Al may diffuse from the work function metal layers 226a and 226b. As shown in FIG. 11, because the second work function metal layer 226b is in contact with the second high-k gate dielectric layer 222b, Al may diffuse into the second high-k gate dielectric layer 222b. Consequently, the second high-k gate dielectric layer 222b may include metal material, such as Al. Similarly, Al may diffuse from the first work function metal layer 226a. However, because the first barrier layer 224a is disposed between the first work function metal layer 226a and the first high-k gate dielectric layer 222a, the first barrier layer 224a may mitigate the Al diffusion. It should be noted that in some comparative approaches, a barrier layer with a thickness the same as that of the first barrier layer 224a is not sufficient to mitigate the Al diffusion. In contrast to the comparative approaches, the method 10 includes increasing the nitrogen concentration in the first barrier layer 224a such that, as mentioned above, the first barrier layer 224a is referred to as an N-containing barrier layer. Nitrogen in the N-containing barrier layer 224a helps to obstruct Al diffusion even in such a thin layer (i.e., a layer having a thickness less than 1.5 nanometer). Therefore, Al diffusion into the first high-k gate dielectric layer 222a is less than that into the second high-k gate dielectric layer 222b. In some embodiments, the first high-k gate dielectric layer 222a may still include the metal material such as Al, but a metal concentration (i.e., the Al concentration) of the first high-k gate dielectric layer 222a is less than a metal concentration (i.e., the Al concentration) of the second high-k gate dielectric layer 222b.

It should be noted that the second high-k gate dielectric layer 222b with greater Al concentration is suitable for an LV device, and the first high-k gate dielectric layer 222b with a lower Al concentration is suitable for an HV device. Accordingly, the semiconductor structure 20 is a multiple-Vt structures suitable for device design.

Accordingly, the method 10 includes forming the N-containing barrier layer 224a by in-situ and/or ex-situ treatment for the HV device. The N-containing barrier layer 224a is able to mitigate the Al diffusion with a relatively thinner profile. Further, such thin barrier layer 224a renders less impact on gap filling. In short, the method 10 provides the N-containing barrier in order to meet multiple-Vt structure requirements with competitive gap-filling ability.

Figure 12:
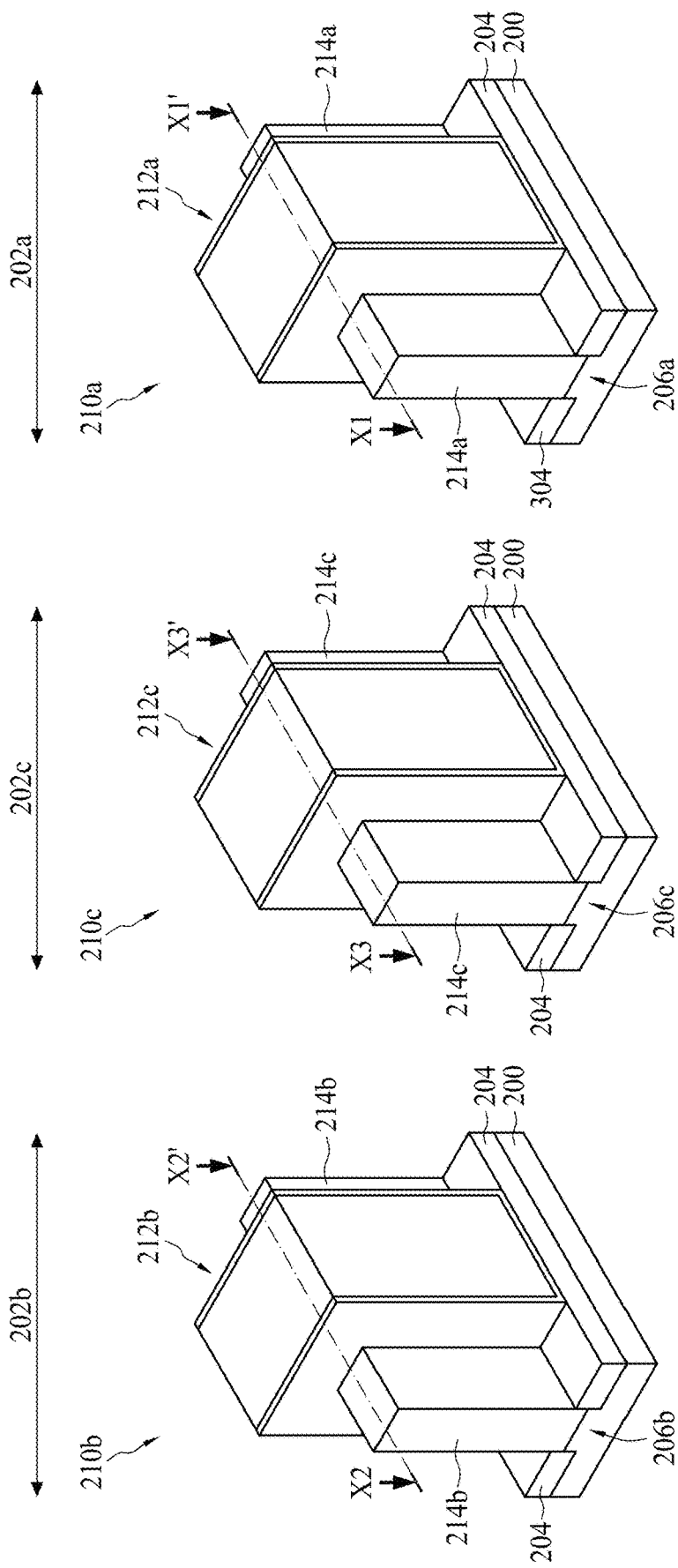
FIG. 12 shows perspective views illustrating portions of a semiconductor structure at a fabrication stage according to aspects of the present disclosure in one or more embodiments.
Figure 13:
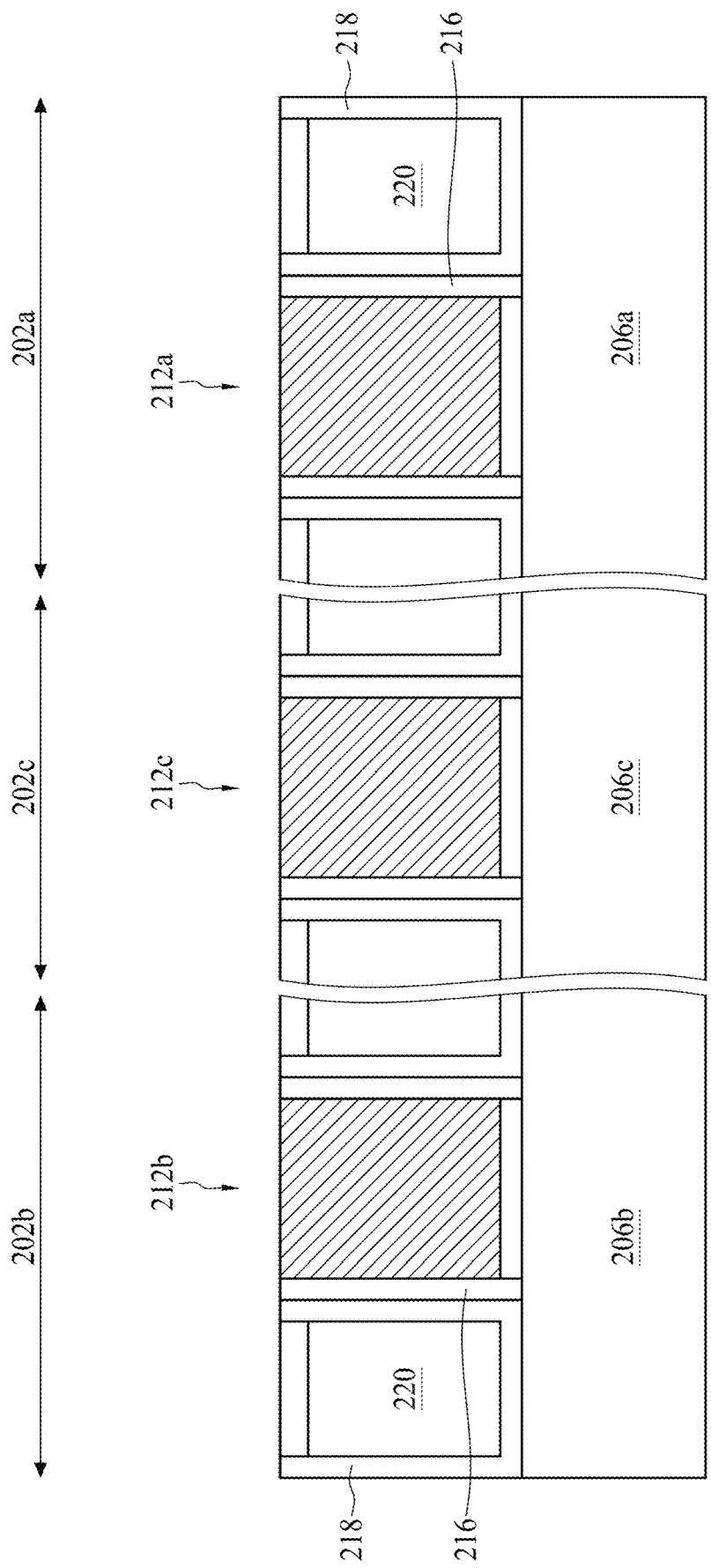
FIG. 13 shows cross-sectional views taken along lines X1-X1', X2-X2' and X3-X3' of FIG. 12, respectively.

FIG. 12 shows perspective views illustrating portions of a semiconductor structure according to aspects of the present disclosure, FIG. 13 shows cross-sectional views taken along lines X1-X1', X2-X2' and X3-X3' of FIG. 12, respectively, and FIGS. 14 to 21 are schematic drawings illustrating the semiconductor structure at various fabrication stages subsequent to the stage shown in FIG. 13 according to aspects of the present disclosure in one or more embodiments. It should be noted that same elements in FIGS. 2 to 11 and FIGS. 12 to 21 are indicated by same numerals, and can include a same material. Thus, repeated descriptions of details are omitted for brevity.

In some embodiments, in operation 101, the method 10 includes forming a first FET device 210a, a second FET device 210b and a third FET device 210c over a substrate 200. As mentioned above, the substrate 200 may include regions designed for different device types. For example, the substrate 200 may include a first region 202a, a second region 202b and a third region 202c. Further, the substrate 200 may include isolation structures, e.g., STI structures 204, interposing the regions 202a, 202b and 202c. The regions 202a, 202b and 202c are defined for accommodating different devices. For example, the first region 202a may accommodate an HV device, the second region 202b may accommodate an LV device, and the third region 202c may accommodate a middle voltage (MV) device. In some embodiments, the HV device used herein is a device have an operating voltage greater than that of the LV device, and the MV device is a device have an operating voltage between those of the HV device and the LV device. As mentioned above, operating voltages can vary for different applications, thus they are not limited herein. Additionally, the region arrangement is not limited by FIGS. 12 to 21.

As mentioned above, the devices 210a to 210c may be planar transistors or multi-gate transistors, such as FinFETs. The first and second FET devices 210a and 210b are similar to those described above; therefore, repeated descriptions of details are omitted for brevity.

In some embodiments, in operation 101, the third FET device 210c is formed in the third region 202c. In some embodiments, the third FET device 210c may be an MV device. In some embodiments, the third FET device 210c may an n-type MV device, but the disclosure is not limited thereto. The third FET device 210c may include a third gate structure 212c and a third source/drain 214c. In some embodiments, the third FET device 210c may be a third FinFET device, and a third fin structure 206c is disposed over the substrate 200, as shown in FIG. 12. The third gate structure 212c is a sacrificial gate structure. As mentioned above, the sacrificial gate structure may include a dielectric layer and a sacrificial semiconductor layer. As also mentioned above, spacers 216 (shown in FIG. 13) can be formed over sidewalls of the sacrificial gate structure 212c.

As shown in FIG. 12, the third source/drain 214c is formed over the third fin structure 206c at two opposite sides of the third gate structure 212c in accordance with some embodiments. In some embodiments, a height of the third source/drain 214c may be greater than a height of the fin structure 206c. In some embodiments, the third source/drain 214c may include strained material serving as stressors that improve carrier mobility. In some embodiments, both of the third source/drain 214c may include n-type dopants, and a dopant concentration of the third source/drain 214c may be different from those of the first source/drain 214a and the second source/drain 214b.

As mentioned above, a CESL 218 may be formed to cover the sacrificial gate structures 212a, 212b and 212c over the substrate 200. Subsequently, an ILD structure 220 may be formed on the CESL 218. A polishing process may be performed on the ILD structure 220 and the CESL 218 to expose top surfaces of the sacrificial gate structures 212a, 212b and 212c, as shown in FIG. 13.

Figure 14:
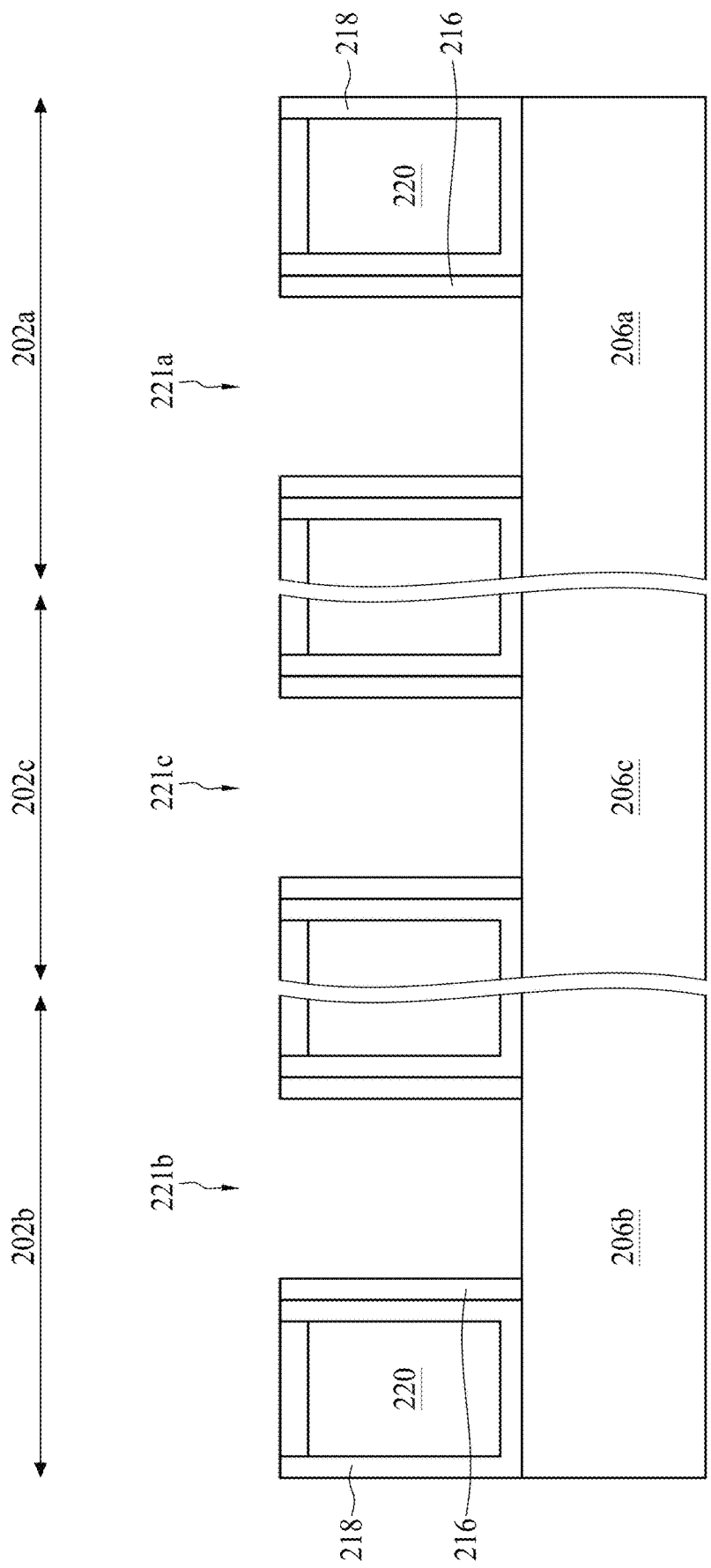
FIGS. 14 to 21 are schematic drawings illustrating the semiconductor structure at various fabrication stages subsequent to the stage shown in FIG. 13 according to aspects of the present disclosure in one or more embodiments.

Referring to FIG. 14, in some embodiments, in operation 102, the method 10 includes forming a first gate trench 221a in the first FET device 210a, a second gate trench 221b in the second FET device 210b, and a third gate trench 221c in the third FET device 210c. As mentioned above, a removal of the dielectric layer may be performed depending on different process or product requirements. In some embodiments, the first fin structure 206a is exposed through the first gate trench 221a, the second fin structure 206b is exposed through the second gate trench 221b, and the third fin structure 206c is exposed through the third gate trench 221c, as shown in FIG. 14.

Figure 15:
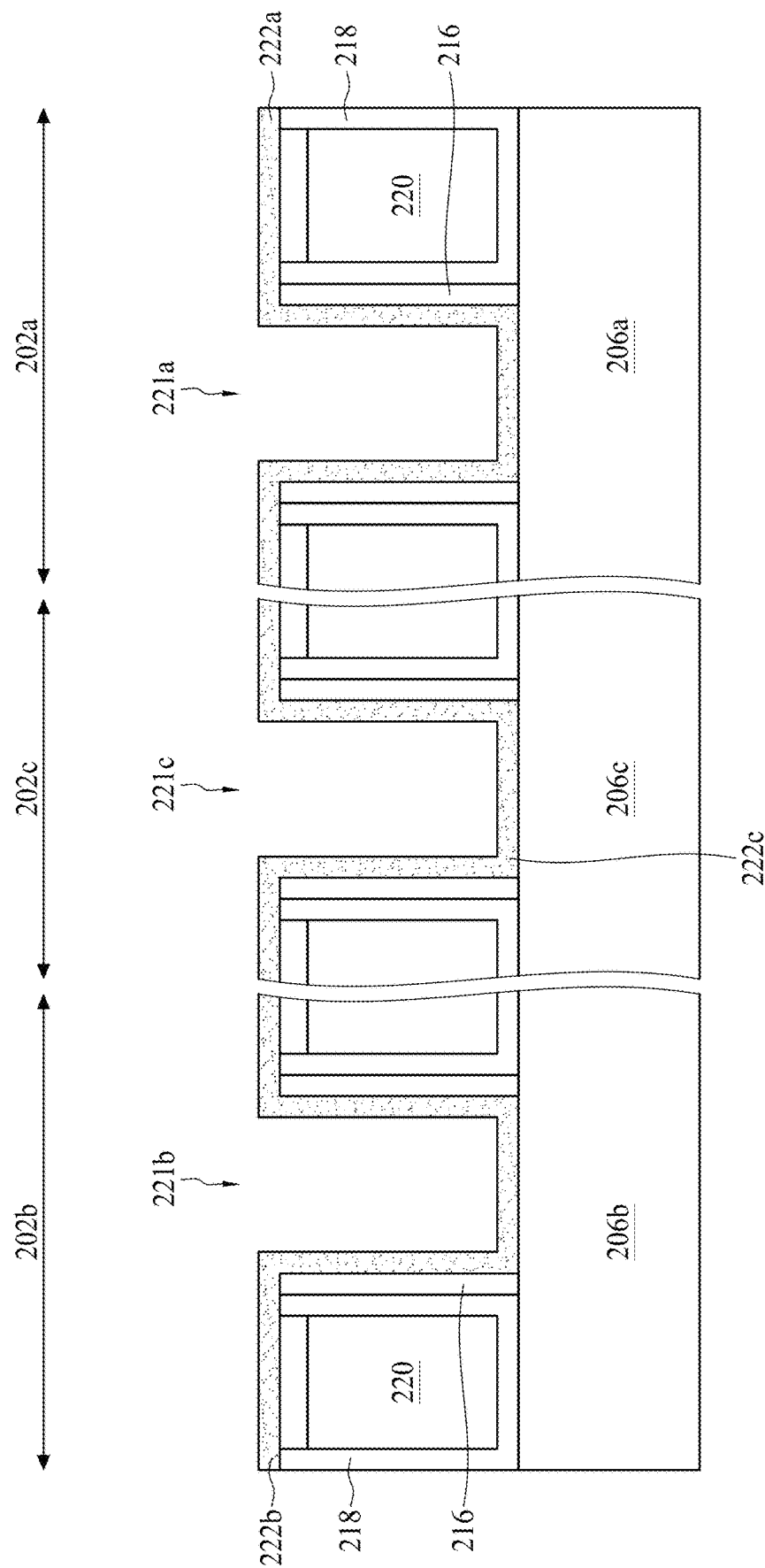

Referring to FIG. 15, in some embodiments, in operation 103, the method 10 includes forming a first high-k gate dielectric layer 222a in the first gate trench 221a, a second high-k gate dielectric layer 222b in the second gate trench 221b, and a third high-k gate dielectric layer 222c in the third gate trench 221c. In some embodiments, an IL layer may be formed prior to the forming of the high-k gate dielectric layers 222a, 222b and 222c, though not shown. In some embodiments, the high-k gate dielectric layers 222a, 222b and 222c may be simultaneously and conformally formed in the gate trenches 221a, 221b and 221c, respectively.

Figure 16:
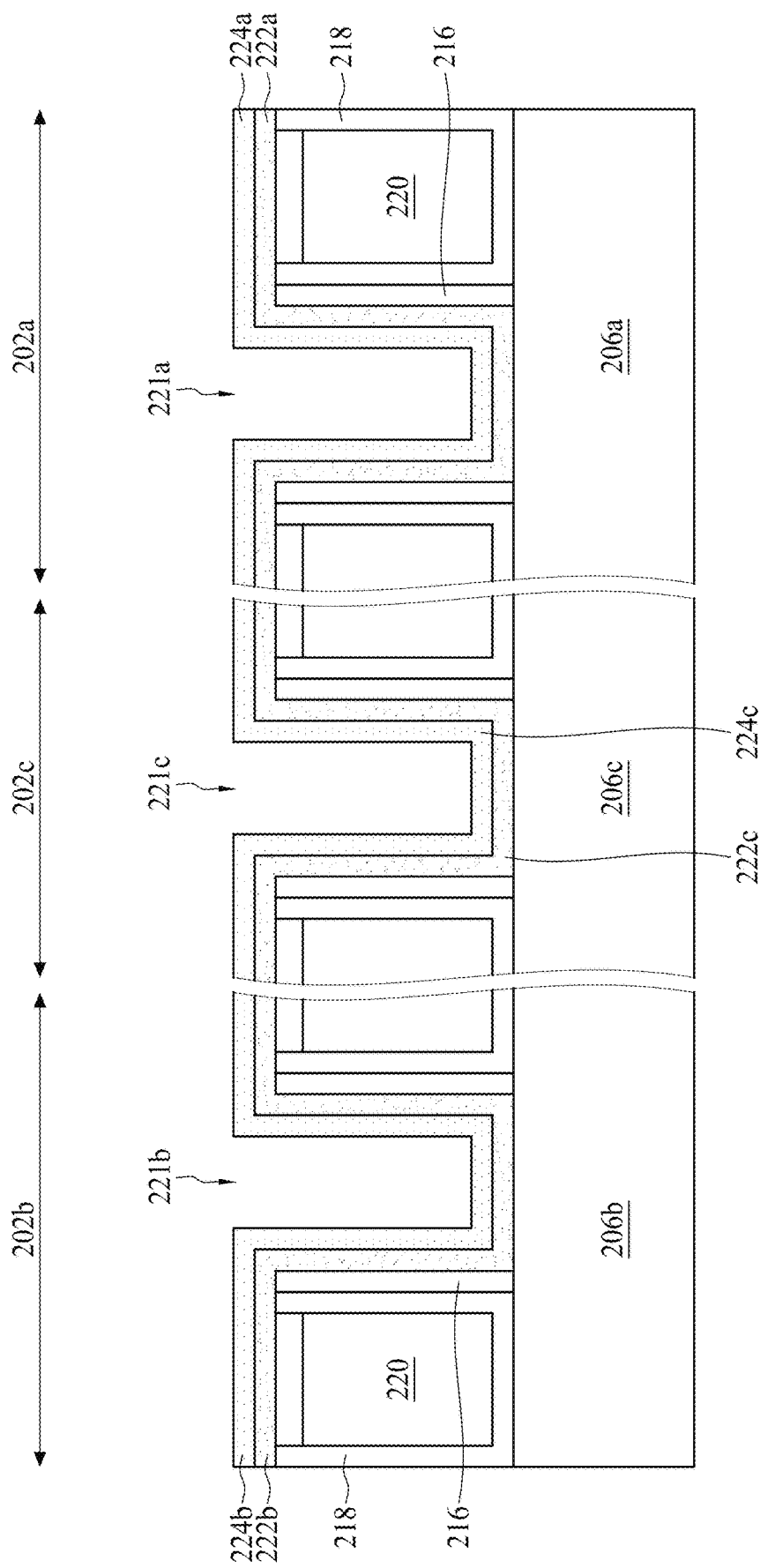

Referring to FIG. 16, in some embodiments, in operation 104, the method 10 includes forming a first barrier layer 224a on the first high-k gate dielectric layer 222a, a second barrier layer 224b on the second high-k gate dielectric layer 222b, and a third barrier layer 224c on the third high-k gate dielectric layer 222c. In some embodiments, the barrier layers 224a, 224b and 224c are formed simultaneously. In some embodiments, the barrier layers 224a, 224b and 224c may be conformally formed in the gate trenches 221a, 221b and 221c, respectively. A thickness of the first barrier layer 224a, a thickness of the second barrier layer 224b and a thickness of the third barrier layer 224c are similar. In some embodiments, the thicknesses of the barrier layers 224a, 224b and 224c may be between approximately 0.1 nanometer and approximately 10 nanometers, but the disclosure is not limited thereto. For example, the thicknesses of the barrier layers 224a, 224b and 224c may be less than approximately 1.5 nanometer. Further, the barrier layers 224a, 224b and 224c include a same material. In some embodiments, the barrier layers 224a, 224b and 224c include tungsten. For example, the barrier layers 224a, 224b and 224c may include W-based metal, such as WNx, WCx, WCxNy, W-based metal with oxygen, W-based metal without oxygen, or combinations thereof. Further, a W concentration in each of the barrier layers 224a, 224b and 224c is between approximately 10% and approximately 70%, but the disclosure is not limited thereto.

In some embodiments, in operation 105, the method 10 includes increasing a nitrogen concentration in each of the barrier layers 224a, 224b and 224c. As mentioned above, the increasing of the N concentrations includes an in-situ treatment and/or an ex-situ treatment. In some embodiments, the N concentration in each of the barrier layers 224a, 224b and 224c may be increased by the in-situ treatment. The in-situ treatment may be similar to those described above; therefore, repeated description of the in-situ treatment is omitted for brevity.

Figure 17:
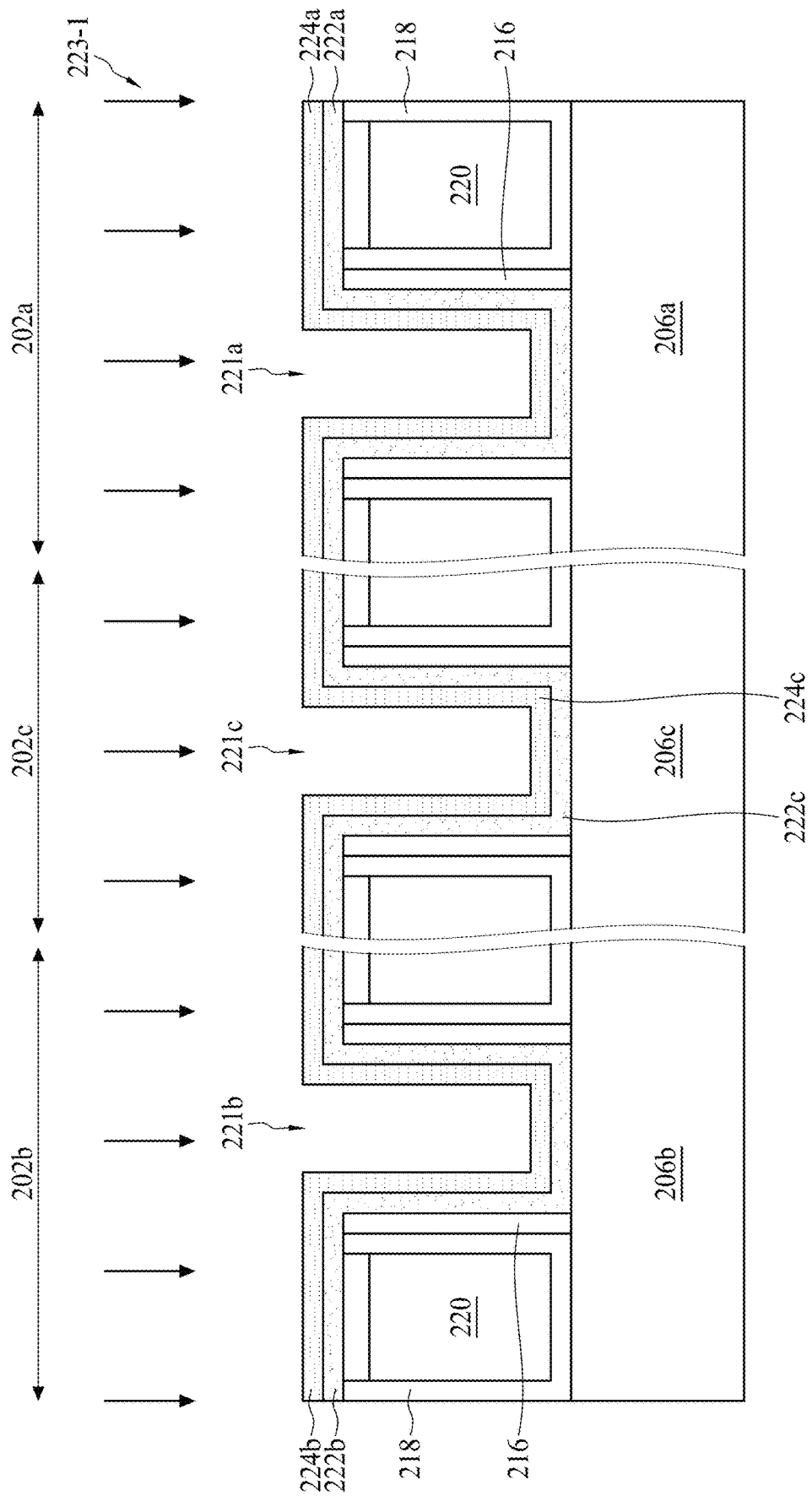

Referring to FIG. 17, in some embodiments, the N concentration in each of the barrier layers 224a, 224b and 224c may be increased by the ex-situ treatment. In some embodiments, the ex-situ treatment may be performed after the in-situ treatment. In other embodiments, the ex-situ treatment may be performed directly after the forming of the barrier layers 224a, 224b and 224c. The ex-situ treatment may include a first nitridation 223-1 using $NH_3$, $N_2$, $H_3$, inert gas, or combinations thereof. Parameters of the first nitridation 223-1 may be similar to those described above; therefore, repeated description of the ex-situ treatment is omitted for brevity.

Figure 18:
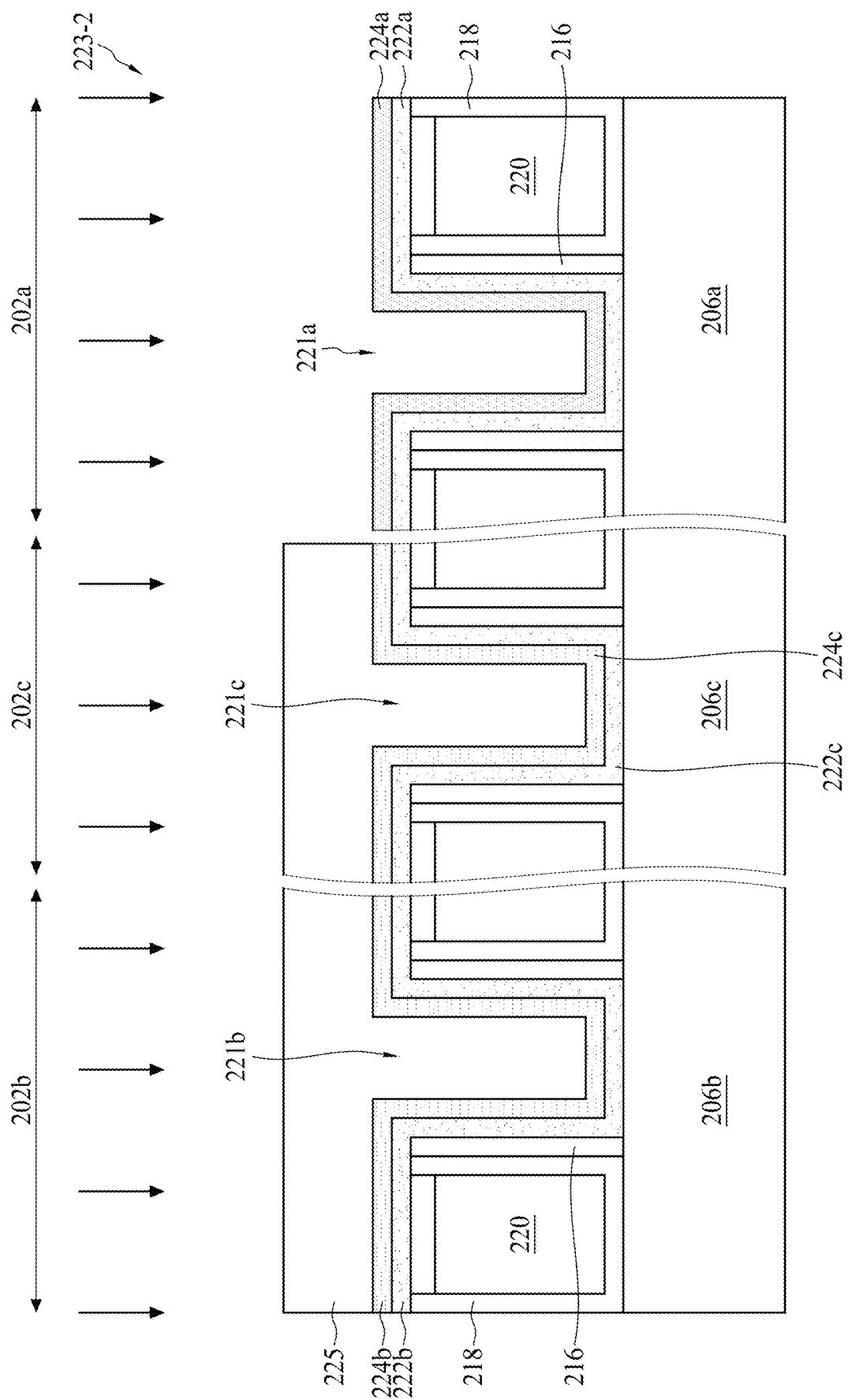

Referring to FIG. 18, in some embodiments, in operation 105, the method 10 may include performing a second nitridation 223-2 to further increase the N concentration. In some embodiments, a masking layer or protecting layer 225 may be formed to cover the second region 202b and the third region 202c. The second nitridation 223-2 may use $NH_3$, $N_2$, $H_3$, inert gas, or combinations thereof. Parameters of the second nitridation 223-2 may be similar to those described above; therefore, repeated description of the ex-situ treatment is omitted for brevity. In some embodiments, the N concentration of the first barrier layer 224a may be further increased, and thus the N concentration of the first barrier layer 224a is greater than the N concentrations of the second barrier layer 224b and the third barrier layer 224c. Additionally, the masking layer or the protecting layer 225 is removed after the second nitridation.

Accordingly, the first, second and third barrier layers 224a, 224b and 224c may be referred to as N-containing barrier layers after the increasing of the N concentration. The N concentration in each of the N-containing barrier layers 224a, 224b and 224c may be increased to between approximately 10% and approximately 70%, but the disclosure is not limited thereto. Further, the N concentration of the first barrier layer 224a is greater than the N concentrations of the second barrier layer 224b and the third barrier layer 224c due to the two ex-situ treatments.

Figure 19:
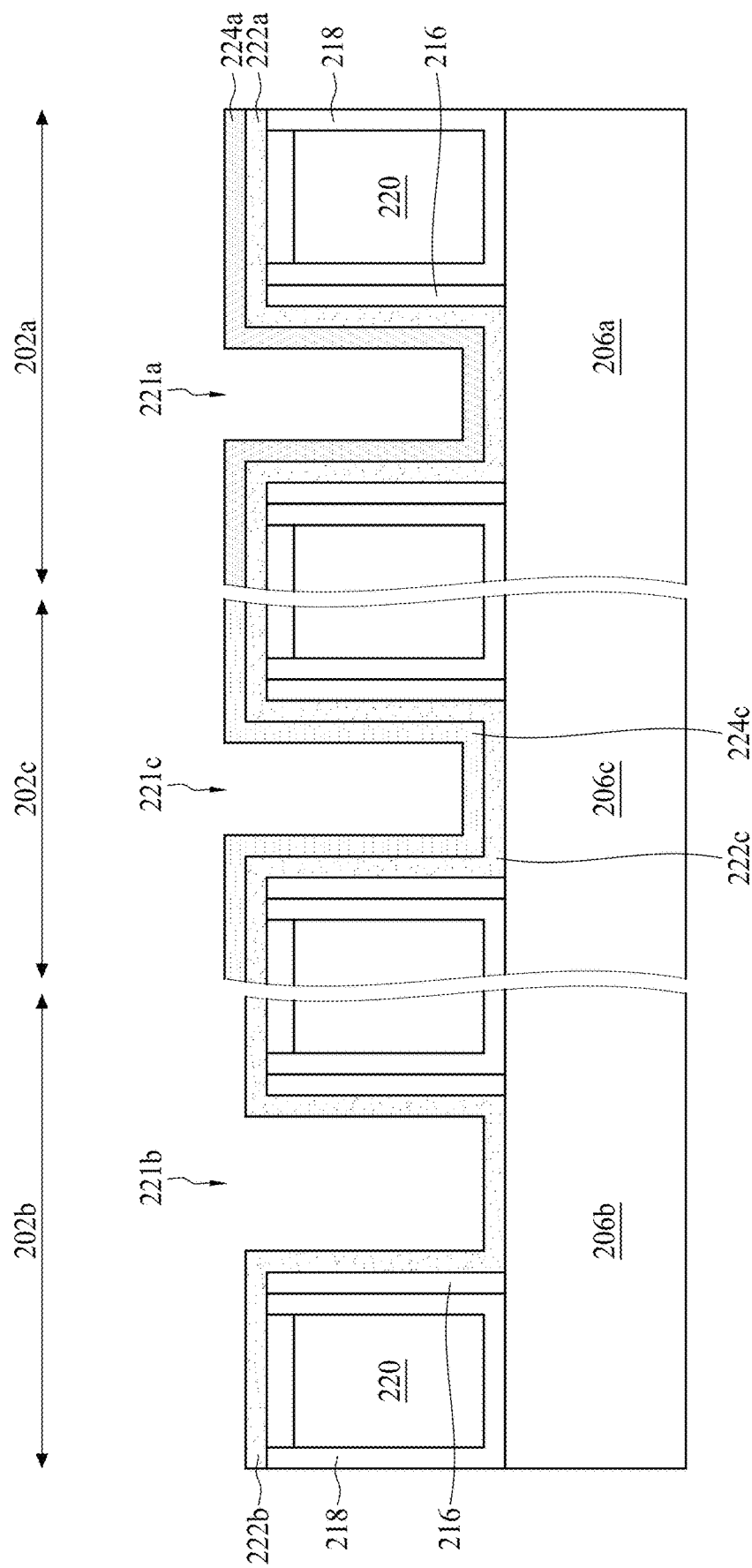

Referring to FIG. 19, in some embodiments, in operation 106, the method 10 includes removing the second barrier layer 224b to expose the second high-k gate dielectric layer 222b in the second gate trench 221b. In some embodiments, a protecting layer or a masking layer (not shown) may be formed in the first region 202a and the third region 202c, and a suitable etching operation may be performed to remove the second barrier layer 224b. Thus, the second barrier layer 224b is removed from the second region 202b. The protecting layer or the masking layer is removed after the removing of the second barrier layer 224b.

Figure 20:
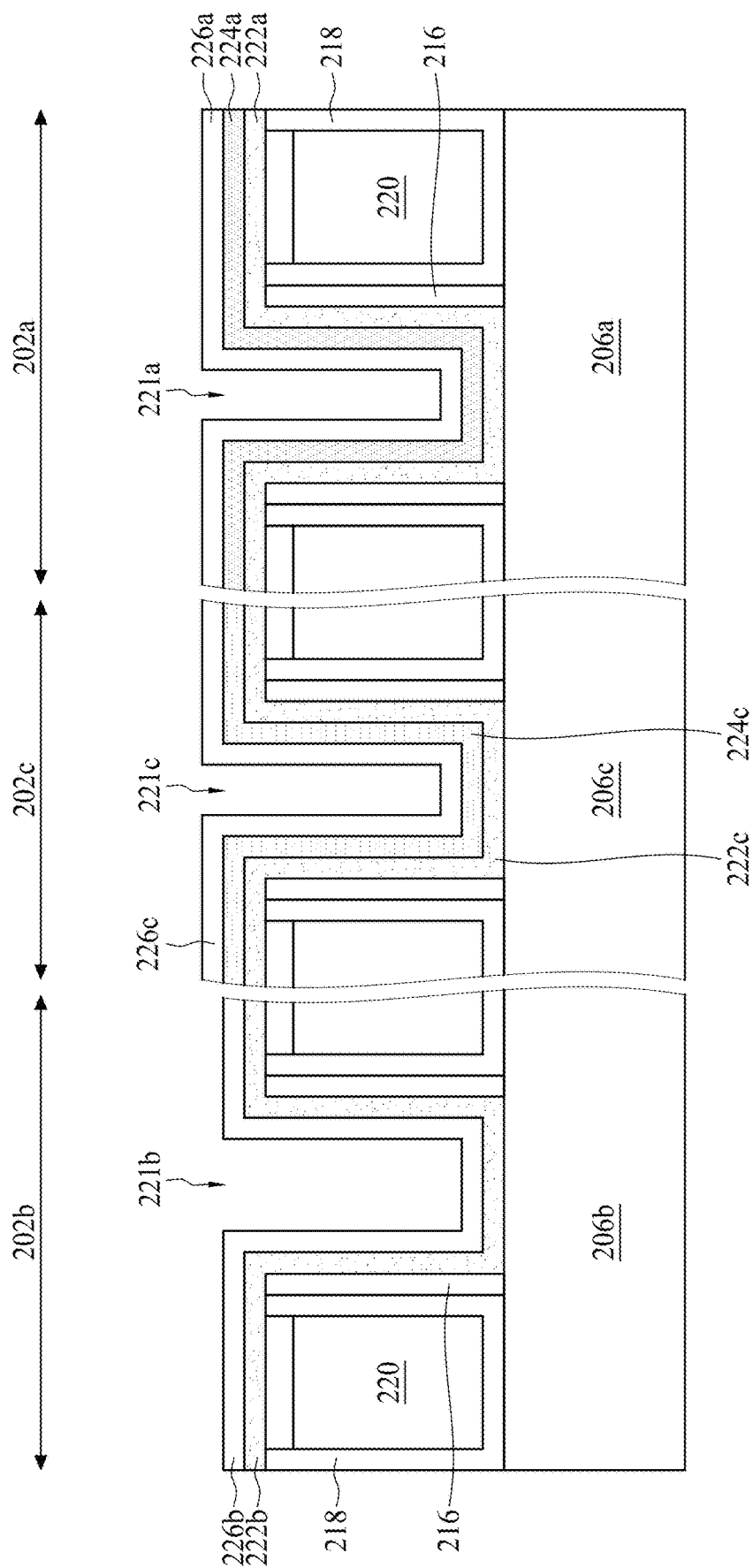

Referring to FIG. 20, in some embodiments, in operation 107, the method 10 includes forming a first work function metal layer 226a over the first barrier layer 224a, a second work function metal layer 226b over the second high-k gate dielectric layer 222b, and a third work function metal layer 226c over the third barrier layer 224c. In some embodiments, the first work function metal layer 226a may be in direct contact with the first barrier layer 224a, and the third work function metal layer 226c may be in direct contact with the third barrier layer 224c. In contrast with the first and third work function metal layers 226a and 226c, the second work function metal layer 226b may be in direct contact with the second high-k gate dielectric layer 222b. A thickness of the first work function metal layer 226a, a thickness of the second work function metal layer 226b and a thickness of the third work function metal layer 226c may be similar. The work function metal layers 226a, 226b and 226c may all be n-type work function metal layers. Further, the work function metal layers 226a, 226b and 226c may include same n-type metal materials. In some embodiments, the work function metal layers 226a, 226b and 226c may all be n-type work function metal layers that includes aluminum.

Figure 21:
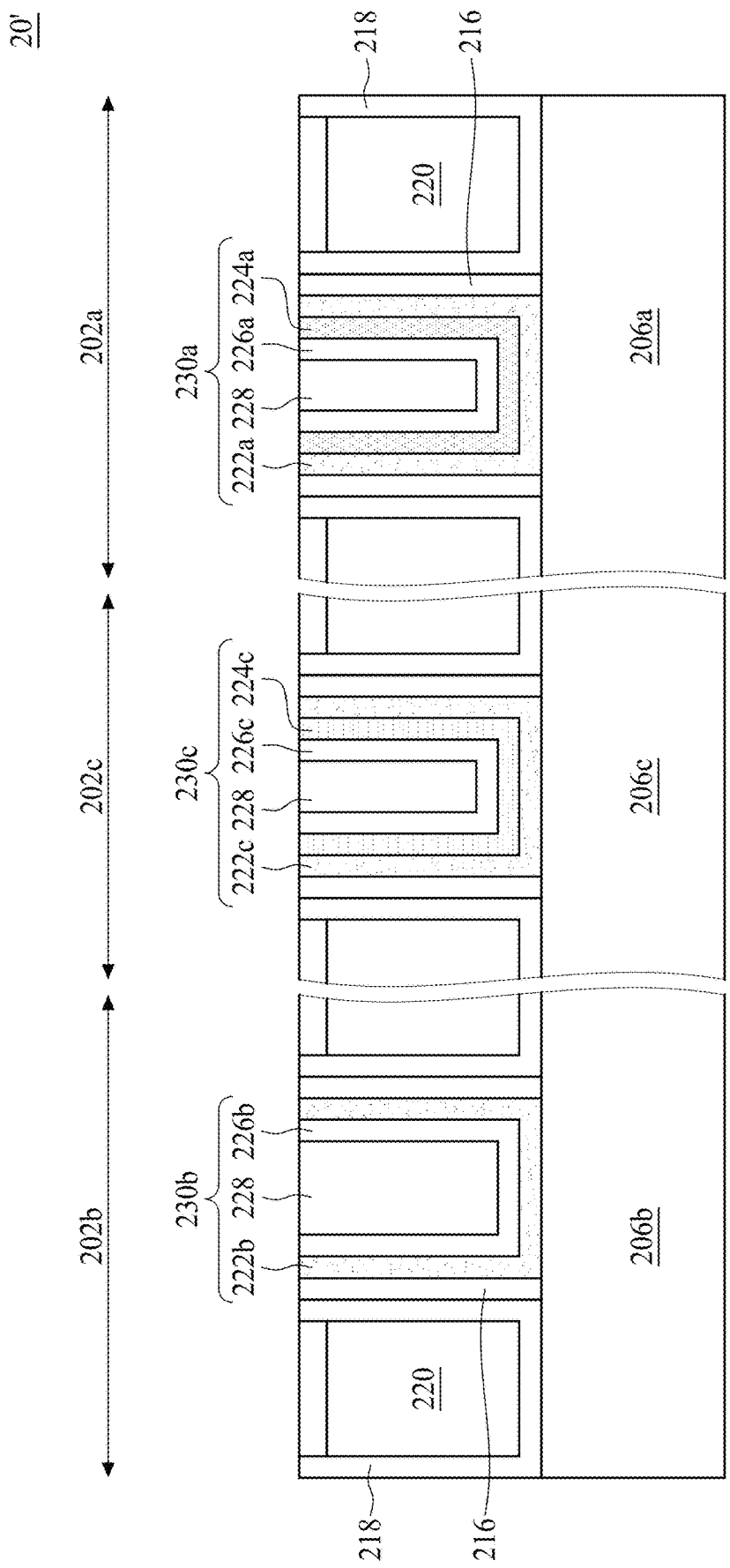

Referring to FIG. 21, in some embodiments, a gap-filling metal layer 228 is formed to fill the first gate trench 221a, the second gate trench 221b and the third gate trench 221c.

Referring to FIG. 21, in some embodiments, a planarization operation such as a CMP may be performed to remove superfluous layers. Accordingly, a first metal gate structure 230a is formed in the first FET device 210a in the first region 202a, a second metal gate structure 230b is formed in the second FET device 210b in the second region 202b, and a third metal gate structure 230c is formed in the third FET device 210c in the third region 202c. In some embodiments, a top surface of the first metal gate structure 230a, a top surface of the second metal gate structure 230b, a top surface of the third metal gate structure 230c, and top surfaces of the ILD structure 220 may be aligned with each other (i.e., the top surfaces may be co-planar).

Accordingly, a semiconductor structure 20' is obtained as shown in FIG. 21. The semiconductor structure 20' includes the first FET device 210a, the second FET device 210b and the third FET device 210c. As mentioned above, the FET devices 210a, 210b and 210c may all be FinFET devices. Therefore, the first FET device 210a includes the first metal gate structure 230a over the first fin structure 206a, the second FET device 210b includes the second metal gate structure 230b over the second fin structure 206b, and the third FET device 210c includes the third metal gate structure 230c over the third fin structure 206c. The first metal gate structure 230a includes the first high-k gate dielectric layer 222a, the first work function metal layer 226a, and the first barrier layer 224a between the first work function metal layer 226a and the first high-k gate dielectric layer 222a. In some embodiments, the N concentration in the first barrier layer 224a is between approximately 10% and approximately 70%. Therefore, the first barrier layer 224a is referred to as an N-containing barrier layer. The third metal gate structure 230c includes the third high-k gate dielectric layer 222c, the third work function metal layer 226c, and the third barrier layer 224c between the third work function metal layer 226c and the third high-k gate dielectric layer 222c. In some embodiments, the N concentration in the third barrier layer 224c is between approximately 10% and approximately 70%. Therefore, the third barrier layer 224c is also referred to as an N-containing barrier layer. However, the N concentration of the first barrier layer 224a is greater than the N concentration of the third barrier layer 224c. The second metal gate structure 230b includes the second high-k gate dielectric layer 222b and the second work function metal layer 226b. As mentioned above, the work function metal layers 226a, 226b and 226c may be n-type work function metal layers. Further, the work function metal layers 226a, 226b and 226c may be Al-containing n-type work function metal layers.

As mentioned above, it is found that Al may diffuse from the work function metal layers 226a and 226b. As shown in FIG. 21, because the second work function metal layer 226b is in contact with the second high-k gate dielectric layer 222b, Al may diffuse into the second high-k gate dielectric layer 222b. Consequently, the second high-k gate dielectric layer 222b may include metal material, such as Al. Similarly, Al may diffuse from the first work function metal layer 226a and from the third work function metal layer 226c. However, the first barrier layer 224a and the third barrier layer 224c may mitigate the Al diffusion due to the introduction of nitrogen. As mentioned above, nitrogen in the N-containing barrier layers 224a and 224c helps to obstruct Al diffusion even in such thin layers. Therefore, Al diffusion into the first high-k gate dielectric layer 222a and the third high-k gate dielectric layer 222c is less than that into the second high-k gate dielectric layer 222b. Further, the first barrier layer 224a may have greater Al diffusion barrier ability due to its greater N concentration. In some embodiments, the first high-k gate dielectric layer 222a, the second high-k gate dielectric layer 222b and the third high-k gate dielectric layer 222c may still include the metal material such as Al, but a metal concentration (i.e., the Al concentration) of the third high-k gate dielectric layer 222c is less than a metal concentration (i.e., the Al concentration) of the second high-k gate dielectric layer 222b, and a metal concentration (i.e., the Al concentration) of the first high-k gate dielectric layer 222a is less than the metal concentration (i.e., the Al concentration) of the third high-k gate dielectric layer 222c.

It should be noted that the second high-k gate dielectric layer 222b with high Al concentration is suitable for an LV device, the first high-k gate dielectric layer 222a with low Al concentration is suitable for an HV device, and the third high-k gate dielectric layer 222c with medium Al concentration is suitable for an MV device. Accordingly, the semiconductor structure 20' is a multiple-Vt structure suitable for device design.

Accordingly, the method 10 includes forming the N-containing barrier layers 224a and 224c with different N concentration by in-situ and ex-situ treatment for the HV device. The N-containing barrier layers 224a and 224c are able to mitigate the Al diffusion, therefore such thin barrier layers have less impact on gap filling. In short, the method 10 provides the N-containing barrier for meeting multiple-Vt structure requirements with competitive gap-filling ability.

In summary, the present disclosure provides a method for forming a semiconductor structure. The method may be integrated into an HKMG process. The method may also be integrated with formation of a planar device or a non-planar device. In some embodiments, the method for forming the semiconductor structure includes in-situ and/or ex-situ nitridation of barrier layers. The barrier layers with different nitrogen concentrations may have different metal barrier abilities, thereby helping the semiconductor structure to meet multiple-Vt structure requirements.

Some embodiments of the present disclosure provide a method for forming a semiconductor structure. The method includes following operations. A first FET device and a second FET device are formed over a substrate. A first gate trench is formed in the first FET device, and a second gate trench is formed in the second FET device. A first high-k gate dielectric layer is formed in the first gate trench, and a second high-k gate dielectric layer is formed in the second gate trench. A first barrier layer is formed over the first high-k gate dielectric layer, and a second barrier layer is formed over the second high-k gate dielectric layer. An N concentration in the first barrier layer and an N concentration in the second barrier layer are increased. The second barrier layer is removed to expose the second high-k gate dielectric layer. A first work function metal layer is formed over the first barrier layer, and a second work function metal layer is formed over the second high-k gate dielectric layer.

Some embodiments of the present disclosure provide a method for forming a semiconductor structure. The method includes following operations. A first FET device, a second FET device and a third FET device are formed over a substrate. A first gate trench is formed in the first FET device, a second gate trench is formed in the second FET device, and a third gate trench is formed in the third FET device. A first high-k gate dielectric layer is formed in the first gate trench, a second high-k gate dielectric layer is formed in the second gate trench, and a third high-k gate dielectric layer is formed in the third gate trench. A first barrier layer is formed over the first high-k gate dielectric layer, a second barrier layer is formed over the second high-k gate dielectric layer, and a third barrier layer is formed over the third high-k gate dielectric layer. A first nitridation is performed on the first barrier layer, the second barrier layer and the third barrier layer. A second nitridation is performed on the first barrier layer. The second barrier layer is removed to expose the second high-k gate dielectric layer in the second gate trench. A first work function metal layer is formed over the first barrier layer, a second work function metal layer is formed over the second high-k gate dielectric layer, and a third work function metal layer is formed over the third barrier layer.

Some embodiments of the present disclosure provide a method for forming a semiconductor structure. The method includes following operations. A first FET device, a second FET device and a third FET device are formed over a substrate. A first gate trench is formed in the first FET device, a second gate trench is formed in the second FET device, and a third gate trench is formed in the third FET device. A first high-k gate dielectric layer is formed in the first gate trench, a second high-k gate dielectric layer is formed in the second gate trench, and a third high-k gate dielectric layer is formed in the third gate trench. A first barrier layer is formed over the first high-k gate dielectric layer, a second barrier layer is formed over the second high-k gate dielectric layer, and a third barrier layer is formed over the third high-k gate dielectric layer. An N concentration of the first barrier layer, an N concentration of the second barrier layer and an N concentration of the third barrier layer are increased. A protecting layer is formed over the second barrier layer and the third barrier layer. The N concentration of the first barrier layer is increased. The protecting layer is removed. The second barrier layer is removed to expose the second high-k gate dielectric layer in the second gate trench. A first work function metal layer is formed over the first barrier layer, a second work function metal layer is formed over the second high-k gate dielectric layer, and a third work function metal layer is formed over the third barrier layer. The first high-k gate dielectric layer, the second high-k gate dielectric layer and the third high-k gate dielectric layer include a same metal material.

Some embodiments of the present disclosure provide semiconductor structure. The semiconductor structure includes a first transistor and a second transistor. The first transistor includes a first gate dielectric layer, a first work function metal layer over the first gate dielectric layer, and a W-and-N-containing layer between the first work function metal layer and the first gate dielectric layer. The second transistor includes a second gate dielectric layer and a second work function metal layer over the second gate dielectric layer.

Some embodiments of the present disclosure provide a semiconductor multi-Vt device. The semiconductor multi-Vt device includes a HV transistor and a MV transistor. The HV transistor includes a first gate dielectric layer and a first conductive layer over the first gate dielectric layer. The first conductive layer includes W and N. The MV transistor includes a second gate dielectric layer and a second conductive layer over the second gate dielectric layer. The second conductive layer includes W and N.

Some embodiments of the present disclosure provide a semiconductor multi-Vt device. The semiconductor multi-Vt device includes a HV transistor, a LV transistor and a MV transistor. The HV transistor includes a first gate dielectric layer, a first work function metal layer over the first gate dielectric layer, and a first WN-containing layer between the first gate dielectric layer and the first work function metal layer. The LV transistor includes a second gate dielectric layer, and a second work function metal layer over the second gate dielectric layer. The MV transistor includes a third gate dielectric layer, a third work function metal layer over the third gate dielectric layer, and a second WN-containing layer between the third gate dielectric layer and the third work function metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a first transistor comprising:
      a first gate dielectric layer;
      a first work function metal layer over the first gate dielectric layer; and
      a tungsten-and-nitrogen-containing layer between the first work function metal layer and the first gate dielectric layer; and
   a second transistor comprising:
      a second gate dielectric layer; and
      a second work function metal layer over the second gate dielectric layer,
   wherein the first gate dielectric layer comprises aluminum (Al) with a first Al concentration, the second gate dielectric layer comprises Al with a second Al concentration, and the first Al concentration is less than the second Al concentration.

2. The semiconductor structure of claim 1, wherein the tungsten-and-nitrogen-containing layer comprises aluminum.

3. The semiconductor structure of claim 1, wherein the first work function metal layer and the second work function metal layer respectively comprise an aluminum-containing n-type work function metal layer.

4. The semiconductor structure of claim 1, wherein a nitrogen concentration in the tungsten-and-nitrogen-containing layer is between approximately 10% and approximately 70%.

5. The semiconductor structure of claim 1, wherein a tungsten concentration in the tungsten-and-nitrogen-containing layer is between approximately 10% and approximately 70%.

6. The semiconductor structure of claim 1, wherein the tungsten-and-nitrogen-containing layer comprises WNx, WCx, WCxNy, W-based metal with oxygen, W-based metal without oxygen, or combinations thereof.

7. The semiconductor structure of claim 1, further comprising:
   a first fin structure, wherein the first gate dielectric layer, the first work function metal layer and the tungsten-and-nitrogen-containing layer are disposed over the first fin structure; and a second fin structure, wherein the second gate dielectric layer and the second work function metal layer are disposed over the second fin structure.

8. A semiconductor multiple threshold voltage (multi-Vt) device, comprising:
a high-voltage (HV) transistor comprising:
a first gate dielectric layer; and
a first conductive layer over the first gate dielectric layer, and comprising tungsten and nitrogen; and
a middle-voltage (MV) transistor comprising:
a second gate dielectric layer comprising aluminum; and
a second conductive layer over the second gate dielectric layer, and comprising tungsten and nitrogen,
wherein the first gate dielectric layer comprises Al with a first Al concentration, the second gate dielectric layer comprises Al with a second Al concentration, and the first Al concentration is less than the second Al concentration.

9. The semiconductor multi-Vt device of claim 8, wherein the first conductive layer and the second conductive layer respectively comprise WNx, WCx, WCxNy, W-based metal with oxygen, W-based metal without oxygen, or combinations thereof.

10. The semiconductor multi-Vt device of claim 8, wherein a nitrogen concentration of the first conductive layer and a nitrogen concentration of the second conductive layer are respectively between approximately 10% and approximately 70%.

11. The semiconductor multi-Vt device of claim 10, wherein the nitrogen concentration of the first conductive layer is greater than the nitrogen concentration of the second conductive layer.

12. The semiconductor multi-Vt device of claim 8, wherein a tungsten concentration in the first conductive layer is between approximately 10% and approximately 70%, and a tungsten concentration in the second conductive layer is between approximately 10% and approximately 70%.

13. The semiconductor multi-Vt device of claim 8, wherein a thickness of the first conductive layer is similar to a thickness of the second conductive layer.

14. The semiconductor multi-Vt device of claim 8, wherein
the HV transistor further comprises a first work function metal layer, wherein the first conductive layer is disposed between the first work function metal layer and the first gate dielectric layer; and
the MV multi-gate transistor further comprises a second work function metal layer, wherein the second conductive layer is disposed between the second work function metal layer and the second gate dielectric layer.

15. The semiconductor multi-Vt device of claim 14, wherein the first work function metal layer and the second work function metal layer are Al-containing work function metal layers.

16. The semiconductor multi-Vt device of claim 8, further comprising:
a first fin structure, wherein the first gate dielectric layer and the first conductive layer are disposed over the first fin structure; and
a second fin structure, wherein the second gate dielectric layer and the second conductive layer are disposed over the second fin structure.

17. A semiconductor multi-Vt device comprising:
a HV transistor comprising:
a first gate dielectric layer;
a first work function metal layer over the first gate dielectric layer; and
a first tungsten-and-nitrogen-containing (WN-containing) layer between the first gate dielectric layer and the first work function metal layer;
a low-voltage (LV) transistor comprising:
a second gate dielectric layer; and
a second work function metal layer over the second gate dielectric layer; and
a MV structure comprising:
a third gate dielectric layer;
a third work function metal layer over the second gate dielectric layer; and
a second WN-containing layer between the third gate dielectric layer and the third work function metal layer,
wherein the first gate dielectric layer, the second gate dielectric layer and the third gate dielectric layer comprise aluminum, the first gate dielectric layer has a first Al concentration, the second gate dielectric layer has a second Al concentration, the third gate dielectric layer has a third Al concentration, and the first Al concentration, the second Al concentration and the third Al concentration are different from each other.

18. The semiconductor multi-Vt device of claim 17, wherein the third Al concentration is less than the second Al concentration, and the first Al concentration is less than the third Al concentration.

19. The semiconductor multi-Vt device of claim 17, wherein the first work function metal layer, the second work function metal layer and the third work function metal layer are Al-containing work function metal layers.

20. The semiconductor multi-Vt device of claim 17, further comprising:
a first fin structure, wherein the first gate dielectric layer, the first work function metal layer and the first WN-containing layer are disposed over the first fin structure;
a second fin structure, wherein the second gate dielectric layer and the second work function metal layer are disposed over the second fin structure; and
a third fin structure, wherein the third gate dielectric layer, the third work function metal layer and the second WN-containing layer are disposed over the third fin structure.

* * * * *